US007696671B2

(12) United States Patent
Sawada et al.

(10) Patent No.: US 7,696,671 B2
(45) Date of Patent: Apr. 13, 2010

(54) ARRAY ULTRASONIC TRANSDUCER HAVING PIEZOELECTRIC DEVICES

(75) Inventors: Yukihiko Sawada, Yoshikawa (JP); Akiko Mizunuma, Tokyo (JP); Katsuhiro Wakabayashi, Tokyo (JP); Takuya Imahashi, Kawasaki (JP); Sunao Sato, Tokyo (JP)

(73) Assignees: Olympus Medical Systems Corporation, Tokyo (JP); Olympus Corporation, Tokyo (JP)

( * ) Notice: Subject to any disclaimer, the term of this patent is extended or adjusted under 35 U.S.C. 154(b) by 354 days.

(21) Appl. No.: 11/665,208

(22) PCT Filed: Oct. 4, 2005

(86) PCT No.: PCT/JP2005/018358

§ 371 (c)(1), (2), (4) Date: May 7, 2007

(87) PCT Pub. No.: WO2006/040962

PCT Pub. Date: Apr. 20, 2006

(65) Prior Publication Data

US 2008/0037808 A1 Feb. 14, 2008

(30) Foreign Application Priority Data

Oct. 15, 2004 (JP) ............................. 2004-301572
Nov. 5, 2004 (JP) ............................. 2004-321470
Jan. 31, 2005 (JP) ............................. 2005-024385

(51) Int. Cl.
*H01L 41/08* (2006.01)

(52) U.S. Cl. ........................ 310/334; 600/457; 600/459

(58) Field of Classification Search ................. 310/334; 600/459
See application file for complete search history.

(56) References Cited

U.S. PATENT DOCUMENTS

| | | | | |
|---|---|---|---|---|
| 5,457,863 | A * | 10/1995 | Thomas et al. | 29/25.35 |
| 6,558,323 | B2 * | 5/2003 | Wakabayashi et al. | 600/437 |
| 6,759,791 | B2 * | 7/2004 | Hatangadi et al. | 310/334 |
| 6,821,253 | B2 * | 11/2004 | Wakabayashi et al. | 600/459 |
| 6,859,984 | B2 * | 3/2005 | Dinet et al. | 29/25.35 |
| 2003/0009873 | A1 | 1/2003 | Hatangadi et al. | |

FOREIGN PATENT DOCUMENTS

| | | |
|---|---|---|
| JP | 56-17026 | 4/1981 |
| JP | 03-270500 | 12/1991 |

(Continued)

*Primary Examiner*—J. SanMartin
(74) *Attorney, Agent, or Firm*—Scully, Scott, Murphy & Presser, P.C.

(57) ABSTRACT

An ultrasonic transducer in which lead wire connection is facilitated even when piezoelectric devices are divided in order to prevent lateral vibrations from affecting longitudinal vibrations is manufactured by a method comprising: a step in which first dicing grooves are formed on an acoustic matching layer and a piezoelectric device plate that are mounted together in order to form a plurality of piezoelectric devices; a step in which a board and the respective piezoelectric devices are connected together; a step in which surfaces in the vicinity of locations at which the board and the piezoelectric devices are connected together are coated with a conductive sheet; and a step in which the plurality of transducer elements are formed by forming second dicing grooves between the first dicing grooves formed on the piezoelectric devices and the board that is coated with the conductive sheet and on the acoustic matching layer.

1 Claim, 42 Drawing Sheets

FOREIGN PATENT DOCUMENTS

| | | |
|---|---|---|
| JP | 6-41708 | 6/1994 |
| JP | 08-107598 | 4/1996 |
| JP | 2000-253496 | 9/2000 |
| JP | 2001-046368 | 2/2001 |
| JP | 2004-120283 | 4/2004 |
| JP | 2004-517521 | 6/2004 |

* cited by examiner

| $\varepsilon_{33}{}^{T}/\varepsilon_{0}$ | t[mm] | W[mm] | L[mm] | C[pF] | Z[ohm] |
|---|---|---|---|---|---|
| 1700 | 0.2 | 0.1 | 10 | 75.259 | 282.0 |
| 2500 | 0.2 | 0.1 | 10 | 110.675 | 191.7 |
| 8000 | 0.2 | 0.1 | 10 | 354.16 | 59.9 |

FIG. 26

$\varepsilon_{33}^{T}/\varepsilon_{0}$ IS APPROXIMATELY 1500

$\varepsilon_{33}^{T}/\varepsilon_{0}$ IS APPROXIMATELY 2500

ARRAY ULTRASONIC TRANSDUCER HAVING PIEZOELECTRIC DEVICES

TECHNICAL FIELD

The present invention relates to an ultrasonic transducer, to be used in an endoscope, for obtaining ultrasonic cross-sectional images by transmitting and receiving ultrasound to and from body cavities and to a method of manufacturing such an ultrasonic transducer, and particularly to an ultrasonic transducer that does not cause crosstalk or disturbances in ultrasonic beams, and to a method of manufacturing such an ultrasonic transducer.

BACKGROUND ART

Conventionally, a diagnostic ultrasound system formed for clinics. This system comprises an ultrasonic transducer, a signal transmitting unit, a signal receiving unit and a display unit. The signal transmitting unit is generated the pulse signals and connected with the ultrasonic transducer to have the pulse signals transmitted into the ultrasound by above transducer. The signal receiving unit is connected with ultrasonic transducer for receiving echo signals varied with the ultrasonic pulse echo from the tissues. The receiving unit is adapted to process the echo signals from the ultrasonic transducer in order to generate output signals to be converted into the image of the tissues. The display unit is connected with the signal receiving unit to display the image of the tissues, on the basis of the output signals from the signal receiving unit.

An ultrasonic transducer comprises a plurality of piezoelectric transducers, and each consisting of a rectangular plate of a piezoelectric device, which were cut out (dicing process) one piezoelectric material. On the side of the piezoelectric device from which acoustic waves are transmitted, an acoustic matching layer is formed for matching acoustic impedances, and an acoustic lens is formed on the surface of the acoustic matching layer. Also, a backing material that is made of rubber or the like, being high loss coefficient (sound attenuation), is adhered to the back side of the piezoelectric device.

An example of an ultrasonic transducer (used in diagnostic ultrasound systems as described above) for transmitting and receiving ultrasound is an array-arranged transducer. The dimensions of the piezoelectric device generally used in the array-arranged transducer are width W, thickness T, and length L. The piezoelectric device used in the array-arranged transducer has electrodes (a ground electrode and a signal electrode) arranged on the upper and lower surfaces. Each electrode area is multiply width W by length L.

When the pulse signal voltage is applied to the above electrodes, longitudinal vibrations in accordance with the thickness T are caused as the principal vibrations, and the lateral vibrations (lengthwise vibrations) in accordance with the width W are also caused as the subsidiary vibrations. In other words, the power of lateral vibrations become strong, when the width W is almost equal to thickness T, and these lateral vibrations may sometimes be superposed on the longitudinal vibrations depending on the shape of the piezoelectric device, such that the longitudinal vibrations are affected. Accordingly, piezoelectric device divided it into two or three pieces in such a manner that each piezoelectric device does not have one proper resonant frequency in the lateral direction.

Here, explanations are given for the steps of manufacturing an ultrasonic transducer; these steps are generally employed in order to configure the piezoelectric device in such a manner that the piezoelectric device does not have a proper resonant frequency (see Patent Document 1, for example)

(1) A backing layer is formed into the decided shape. (backing material forming step)

(2) Lead wires in the form of an FPC (Flexible Printed Circuit) board or the like are connected to electrodes that are formed on the piezoelectric device in a prescribed shape, before or after the backing material forming step. (wiring step).

(3) The first stacked body is formed by mounting the piezoelectric device and the backing layer. (piezoelectric transducer mounting step)

(4) A transducer unit serving as the second stacked body is formed by mounting the first acoustic matching layer to the piezoelectric device included in the first stacked body. (first matching layer mounting step)

(5) Dicing grooves are formed on the transducer unit from the side of the first acoustic matching layer, such that the piezoelectric device is divided into a plurality of transducer elements. (dicing step)

(6) The dicing grooves are filled with resin with particles for reinforcement. (filling step)

(7) The third stacked body is formed by mounting the second acoustic matching layer to the first acoustic matching layer. (second acoustic matching layer mounting step)

(8) An acoustic lens is cast on the third stacked body. (lens casting step)

(9) The third stacked body, including the acoustic lens, is encased. (packaging step)

Ultrasonic transducers are manufactured using the above steps in the conventional process.

Electronically scanning ultrasonic transducer is formed at the distal end of endoscope insertion tube. The ultrasonic transducer on the endoscope is transmitted the ultrasounds in the digestive tract, so this transducer can be received the ultrasounds from the digestive organ such as the stomach, the pancreas, the liver without interfered with the gas or bone. In the electronically scanning ultrasonic transducer, tens or more piezoelectric transducers are arrayed.

FIG. 1 shows a conception of piezoelectric transducers.

As shown in FIG. 1, a piezoelectric transducer 2101 is generally a rectangular shape (hexahedron) whose width is W, thickness is T, and length is L. When a voltage is applied to electrodes (not shown) on the upper and lower surfaces (thickness direction) of the rectangular shape (hexahedron) shown in FIG. 1, the rectangular shape (hexahedron) vibrates in the thickness direction and generates ultrasounds.

It has been disclosed that ultrasonic transducers such as the one described above are very efficient in the coefficient of electromechanical coupling when the W/T ratio of their piezoelectric transducer is equal to or lower than 0.8, and that the smaller the interval "a" between adjacent piezoelectric transducers, the higher the image quality (Patent Document 2 for example). Accordingly, ultrasonic transducers have conventionally been designed in such a manner that the interval "a" between adjacent piezoelectric transducers is as small as possible, and the W/T ratio is equal to or lower than 0.8.

FIG. 2 is a perspective view showing a first example of a conventional ultrasonic transducer. FIG. 3 is a cross-sectional view of the first example of the conventional ultrasonic transducer.

In FIGS. 2 and 3, the ultrasonic transducer comprises piezoelectric transducers 2123 that formed electrode layers on the upper and lower surfaces thereof, acoustic matching layers 2124 (first acoustic matching layer 2124*a* and second acoustic matching layer 2124*b*) formed under the piezoelectric transducer 2123, a GND conduction unit 2125 for connecting to GND the electrodes formed under the piezoelectric transducer 2123, dicing grooves 2126 formed by using a dicing saw (a precision cutting machine) or the like for dividing the piezoelectric transducer 2123 into plural pieces, lead wires 2131 connected to the electrodes on the lower surface of the piezoelectric transducer 2123, and a backing material 2130. In this configuration, an acoustic matching layer and piezoelectric transducers or the like having dicing grooves 2126 between them is referred to in whole as an ultrasonic transducer element.

FIG. 4 is a perspective view showing a second example of a conventional ultrasonic transducer. FIG. 5 is a cross-sectional view of the second example of the conventional ultrasonic transducer.

The transducer shown in FIGS. 4 and 5 is different from that shown in FIGS. 2 and 3 in that one lead wire 2131 is connected to two piezoelectric transducers 2123 (2123*a* and 2123*b*) and two acoustic matching layers 2124 (2124*a* and 2124*b*), and one transducer element consists of a plurality (two in FIG. 5) of transducer sub elements. By employing the configuration of sub elements as described above, it is possible to improve the ultrasonic transmission/reception characteristics (sensitivity, for example) of the ultrasonic transducer.

Here, a method of designing a conventional ultrasonic transducer is described.

(1) The effective width S of the emitting window of an ultrasonic transducer is determined on the basis of the size So of the object that is to be observed by the ultrasonic transducer in such a manner that So<S.

(2) The arraying pitch p in the ultrasonic transducer is calculated S/N: where N is the maximum number of driving channels of diagnostic ultrasound system, S is the effective width.

(3) The element number n of piezoelectric transducers with a W/T ratio of 0.8 or lower that can be included in the arraying pitch p is calculated. In the example of FIGS. 2 and 3, the number of transducer elements is n, and in the example of FIGS. 4 and 5, the number of sub elements is 2n.

In the conventional methods, configurations are employed in which a plurality of piezoelectric elements are formed such that an effective W/T ratio is achieved, as described above. Also, in some cases, fine modification has been performed on the effective width S, such that the effective W/T ratio is achieved.

The electronically scanning ultrasonic transducer is formed at the insertion tube of an endoscope. The ultrasonic transducer on the endoscope is transmitted the ultrasounds in the digestive tract, so this transducer can be received the ultrasounds from the digestive organ such as the stomach, the pancreas, the liver without interfered with the gas or bone. Examples of types of such electronically scanning ultrasonic transducers applied to the endoscopes include the convex type, the linear type, the radial type and the like.

The ultrasonic transducers generally employ the configuration in which a plurality of ultrasonic transducer elements are arrayed for transmitting and receiving the ultrasound, and only the grooves formed at the both side of each element (slots between adjacent transducer elements) are filled with resin (see Patent Document 3 for example).

Also, a method is disclosed in which adhesive is applied to several locations, including the centers of the grooves (see Patent Document 4 for example).

Patent Document 1
Japanese Patent Application Publication No. 2001-46368
Patent Document 2
Japanese Patent No. 56-17026
Patent Document 3
Japanese Patent Application Publication No. 8-107598
Patent Document 4
Japanese Patent Application Publication No. 2000-253496

DISCLOSURE OF THE INVENTION

However, the conventional device has a problem in which, when a transducer element is divided into smaller elements such that the transducer elements do not have a proper resonant frequency in the lateral direction in order to prevent lateral vibrations that are superposed on longitudinal vibrations from affecting the longitudinal vibrations, the number of transducer elements inevitably increases and the width of each transducer element becomes narrower, such that the difficulty in connecting lead wires to the elements increases.

Also, there has been a problem in which, when an FPC board is directly connected to transducer sub elements each having a small width, the stiffness of the FPC board remains as a residual stress such that the reliabilities of the ultrasonic transducers are reduced.

The present invention has been achieved in view of the above problems, and it is an object of the present invention to provide a method of manufacturing an ultrasonic transducer that is highly reliable and allows easy lead wire connections even when transducer elements are divided into smaller elements, and to provide an ultrasonic transducer manufactured on the basis of such a method.

In order to attain the above objects, the present invention employs the configurations as follows.

According to one aspect of the present invention, one method of manufacturing an ultrasonic transducer according to the present invention is a method of manufacturing an ultrasonic transducer comprising a plurality of transducer elements each having a plurality of transducer sub elements.

The above method of manufacturing an ultrasonic transducer comprises:

a first division step in which first dicing grooves are formed on an acoustic matching layer and a piezoelectric device plate that are mounted together in order to form a plurality of piezoelectric devices;

a piezoelectric device/board connection step in which a board and the respective piezoelectric devices formed in the first division step are connected together;

a conductive sheet coating step in which surfaces in the vicinity of locations at which the board and the piezoelectric devices are connected together in the piezoelectric device/board mounting step are coated with a conductive sheet; and a second division step in which the plurality of transducer elements are formed by dicing the second grooves between the first dicing grooves, and these grooves are divided from in the first division step, on the piezoelectric devices and the board being coated with the conductive sheet in the conductive sheet coating step=and on the acoustic matching layer.

Also, the above method of manufacturing an ultrasonic transducer comprises:

a first division step in which first dicing grooves are formed on a backing material and a piezoelectric device plate that are mounted together in order to form a plurality of piezoelectric devices;

a piezoelectric device/board connecting step in which a board and the respective piezoelectric devices formed in the first division step are connected together;

a conductive sheet coating step in which surfaces in the vicinity of locations at which the board and the piezoelectric devices are connected together in the piezoelectric device/board mounting step are coated with a conductive sheet; and a second division step in which the plurality of transducer elements are formed by forming second dicing grooves between the first dicing grooves formed, in the first division step, on the piezoelectric devices and the board being coated with the conductive sheet in the conductive sheet coating step and on the backing material.

Also, a method of manufacturing an ultrasonic transducer according to the present invention is desired to further comprise:

a masking step in which the first dicing grooves formed, in the first division step, on a surface of the respective piezoelectric devices connected to the board in the piezoelectric device/board connection step are masked, said masking step being executed after the piezoelectric device/board connecting step and before the conductive sheet coating step.

Also, in a method of manufacturing an ultrasonic transducer according to the present invention, it is desired that:

the thickness of the conductive sheet is thin.

Also, according to one aspect of the present invention, an ultrasonic transducer according to the present invention is characterized in that:

the transducer elements include a conductive sheet for electrically connecting:

piezoelectric devices;

a board connected to the piezoelectric devices in such a manner that the board is adjacent to the piezoelectric devices;

electrodes formed on main surfaces of the piezoelectric devices; and electrode patterns formed on main surfaces of the board, and wherein:

the piezoelectric device (plate-shape device) is in a divided state in such a manner that the piezoelectric devices respectively correspond to the transducer sub elements; and the board are in a divided state in such a manner that the board respectively correspond to the transducer elements.

Additionally, when severe limitations are placed upon dimensions, as occurs in an ultrasonic transducer to be used in body cavities (like a ultrasound endoscope), there is a problem that wiring to elements consisting of two or more sub element is difficult.

When a plurality of sub elements are connected to one lead wire as shown in FIGS. 4 and 5, the area that can be used for the connection is reduced, such that fine wiring is required. Accordingly, when thermal or mechanical stress is applied during reprocessing, the load on the sub elements caused by the residual stress of wiring patterns increases, such that the risk of breakage increases, which decreases the reliability. Of course, the machinability also decreases.

When, in contrast, the transducer element is not divided into a plurality of sub elements in order to avoid the difficulty of wiring connection (see FIGS. 2 and 3), the aspect ratio of the piezoelectric device increases to 0.8 or higher, the efficiency in coefficient of electromechanical coupling deteriorates such that the sensitivity decreases, and the frequency characteristics deteriorate, being affected by the occurrence of an unnecessary vibration mode. In view of this, the effective width S of the emitting window needs to be changed; however, the effective width S of the emitting window in ultrasonic transducers that are to be used in body cavities cannot be changed, which is problematic.

In the case of cylindrical shaped ultrasonic transducer that are designed to be used in body cavities, functions (such as an optical observation function) that are necessary for safely inserting the transducer into body cavities are formed, and thus the diameter cannot be reduced. In contrast, the diameter cannot be increased in view of the fact that the cylindrical shaped ultrasonic transducer will be inserted into body cavities and an increase in diameter would result in an increase in tenderness that patients feel.

In view of the above problems, it is an object of the present invention to provide an ultrasonic transducer that has a high efficiency in coefficient of electromechanical coupling, is shaped so as to not result in entering the mode in which unnecessary vibrations occur, and has an excellent machinability and a high reliability.

According to one aspect of the present invention, the above object can be achieved by providing an ultrasonic transducer comprising a plurality of piezoelectric transducers for transmitting and receiving ultrasounds, wherein:

the dielectric constant ($\in^T_{33}/\in_0$) of the piezoelectric transducer is equal to or higher than 2500;

the ratio W/t between lateral width W and thickness t of the piezoelectric transducer is equal to or lower than 0.6; and the interval between each pair of adjacent piezoelectric transducers is equal to or smaller than the wavelength of the ultrasound.

According to one aspect of the present invention, the above object can be achieved by providing an ultrasound endoscope comprising the above described ultrasonic transducer.

According to one aspect of the present invention, the above object can be achieved by providing an electronic radial scanning ultrasonic transducer in which a plurality of piezoelectric transducers for transmitting and receiving ultrasounds are arrayed in a cylindrical shape and at a constant interval, and the radius of an outer periphery of the cylindrical shape is equal to or smaller than ten millimeters, wherein:

the dielectric constant ($\in^T_{33}/\in_0$) of the piezoelectric transducer is equal to or higher than 2500;

the ratio W/t between lateral width W and thickness t of the piezoelectric transducer is equal to or lower than 0.6; and the interval between each pair of adjacent piezoelectric transducers is equal to or smaller than the wavelength of the ultrasound.

According to one aspect of the present invention, the above object can be achieved by providing the above electronic radial scanning ultrasonic transducer, wherein:

the ratio between the width W of each of the piezoelectric transducers and the interval between each pair of adjacent piezoelectric transducers is approximately 1:2.

According to one aspect of the present invention, the above object can be achieved by providing an ultrasound endoscope comprising the above electronic radial scanning ultrasonic transducer.

Also, in the technique disclosed in Patent Document 3, a relatively large crosstalk is caused between the adjacent piezoelectric transducers and cannot be suitably applied to the radial type or the convex type in which the transducers are curved.

Also, when the technique disclosed in Patent Document 4 is applied to a device such as an ultrasound endoscope having a small transducer, the crosstalk increases and beam patterns deteriorate and become uneven; i.e., the characteristics of the endoscope deteriorate.

Further, the techniques disclosed in Patent Documents 3 and 4 respectively require the grooves, which have a width of several tens of micrometers, to be evenly filled with resin. However, it is actually impossible to fill the grooves with resin as accurately as is required in Patent Documents 3 and 4, such that when the techniques disclosed in Patent Documents 3 and 4 are applied to an ultrasonic transducer to be used in an ultrasound endoscope having small transducers, the characteristics (sensitivity, example for) of the transducer vary greatly.

In view of the above problems that the conventional techniques have, it is an object of the present invention to provide an ultrasonic transducer in which crosstalk or disturbances are not caused.

A first ultrasonic transducer according to the present invention is an ultrasonic transducer in which a plurality of ultrasonic transducer elements for transmitting and receiving ultrasounds are arrayed, and acoustic matching layers are stacked, wherein:

adhesive is applied to locations that are at both ends, in the longitudinal direction, of grooves between the adjacent ultrasonic transducer elements and that do not contact a transducer element; and a vibration damping (sound attenuation) agent is applied between the adhesive applied to the grooves and the transducer element.

A second ultrasonic transducer according to the present invention is the above first ultrasonic transducer, wherein:

the adhesive is applied to both ends, in the longitudinal direction, of each of the grooves.

A third ultrasonic transducer according to the present invention is the above first ultrasonic transducer, wherein:

the adhesive is a hard resin.

A fourth ultrasonic transducer according to the present invention is one of the above first through third ultrasonic transducers, wherein:

the vibration damping (sound attenuation) agent is a backing material applied to back surfaces of the ultrasonic transducer elements.

A fifth ultrasonic transducer according to the present invention is one of the above first through fourth ultrasonic transducers, wherein:

the ultrasonic transducer is an electronic radial scanning ultrasonic transducer.

An ultrasound endoscope according to the present invention is characterized by comprising one of the above first through fifth ultrasonic transducers.

BRIEF DESCRIPTION OF THE DRAWINGS

FIG. 26 shows the relationship between $\in_{33}{}^{T}/\in_0$ and impedance in the third embodiment;

BEST MODES FOR CARRYING OUT THE INVENTION

Figure 1:
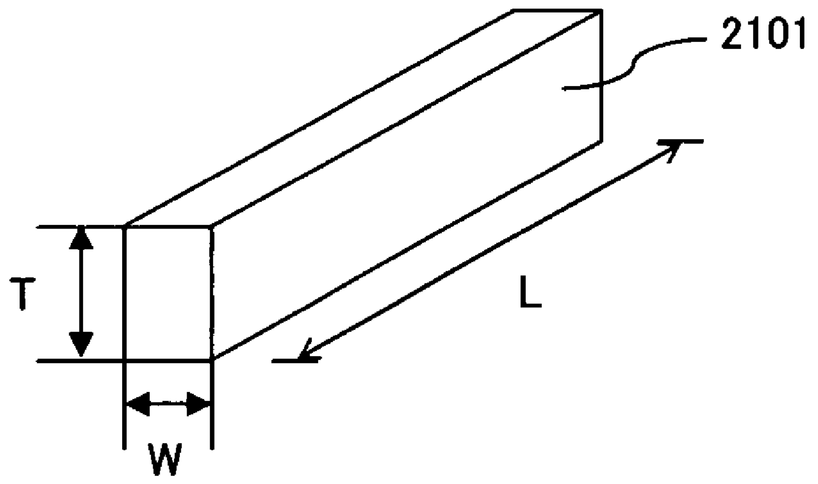
FIG. 1 shows a conception of piezoelectric transducers.
Figure 2:
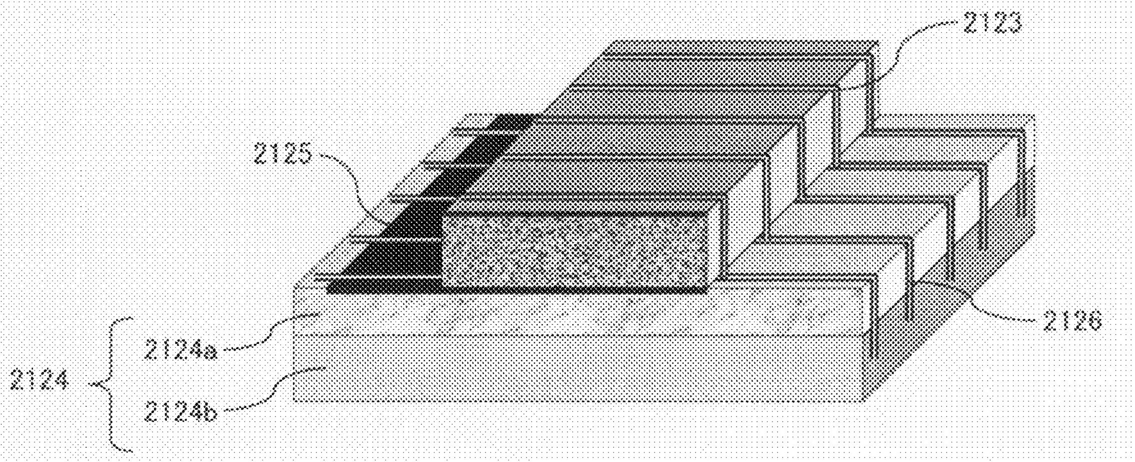
FIG. 2 is a perspective view of a first example of a conventional ultrasonic transducer.
Figure 3:
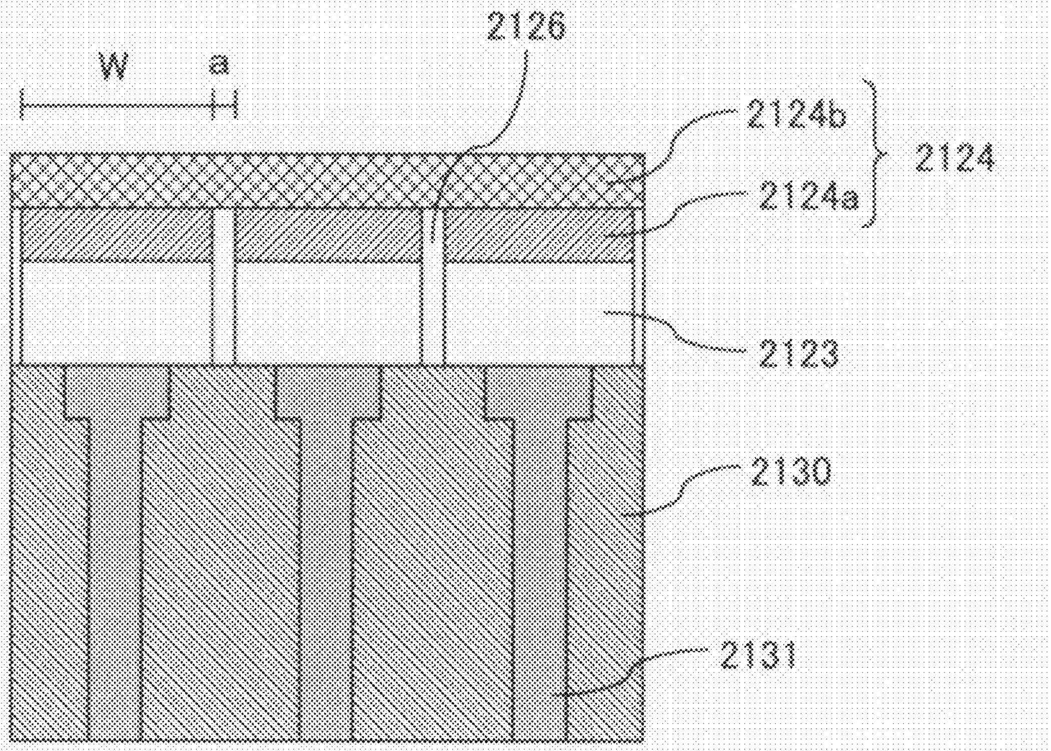
FIG. 3 is a cross-sectional view of the first example of the conventional ultrasonic transducer.
Figure 4:
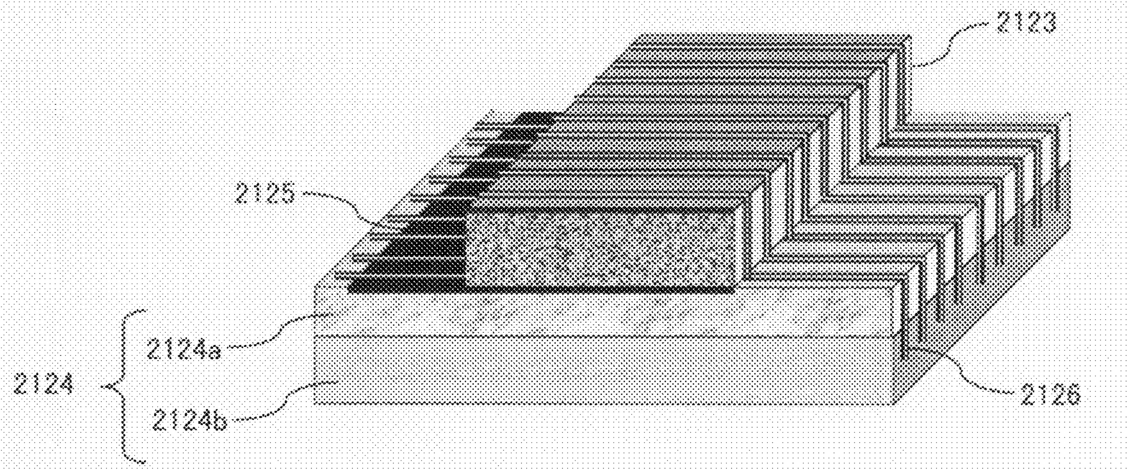
FIG. 4 is a perspective view of a second example of a conventional ultrasonic transducer.
Figure 5:
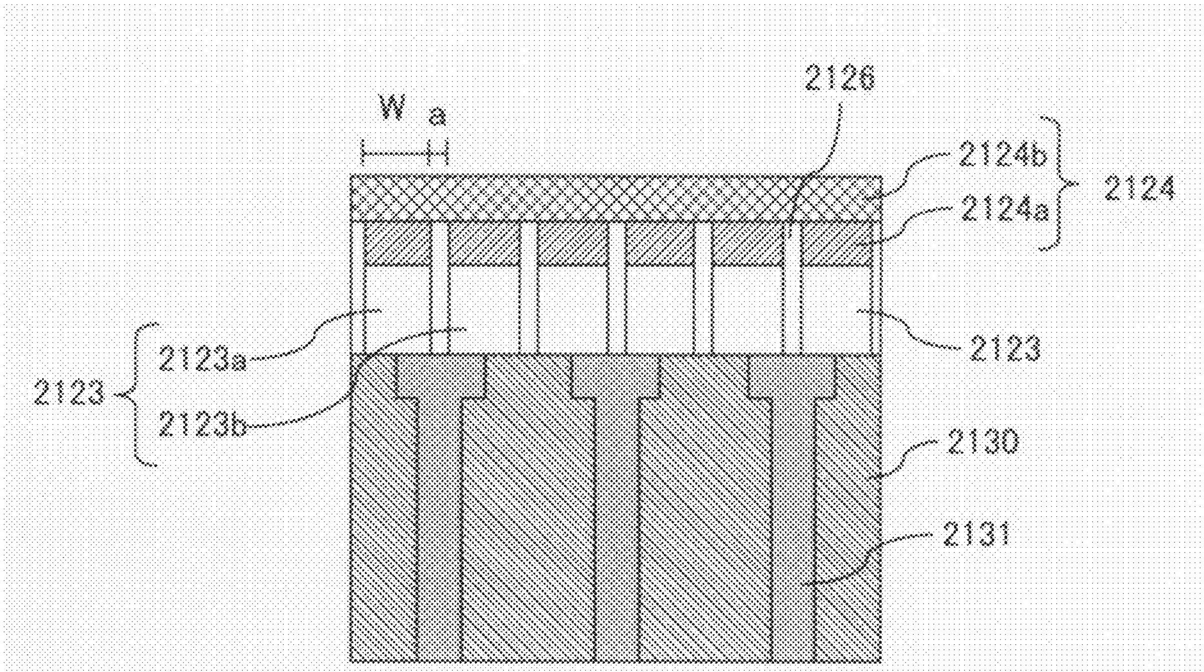
FIG. 5 is a cross-sectional view of the second example of the conventional ultrasonic transducer.

Hereinafter, embodiments of the present invention will be explained by referring to the drawings.

First, the first embodiment to which the present invention is applied is explained by referring to FIGS. 6 through 15.

Figure 6:
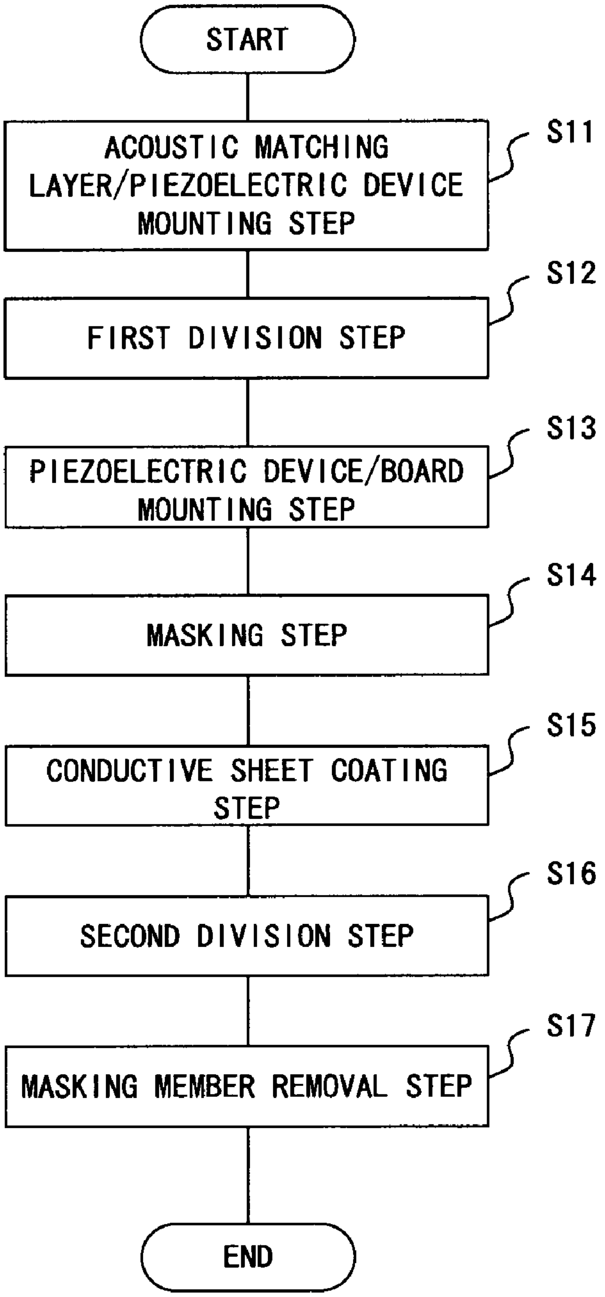
FIG. 6 is a flowchart showing a method of manufacturing an ultrasonic transducer according to a first embodiment.
Figure 7:
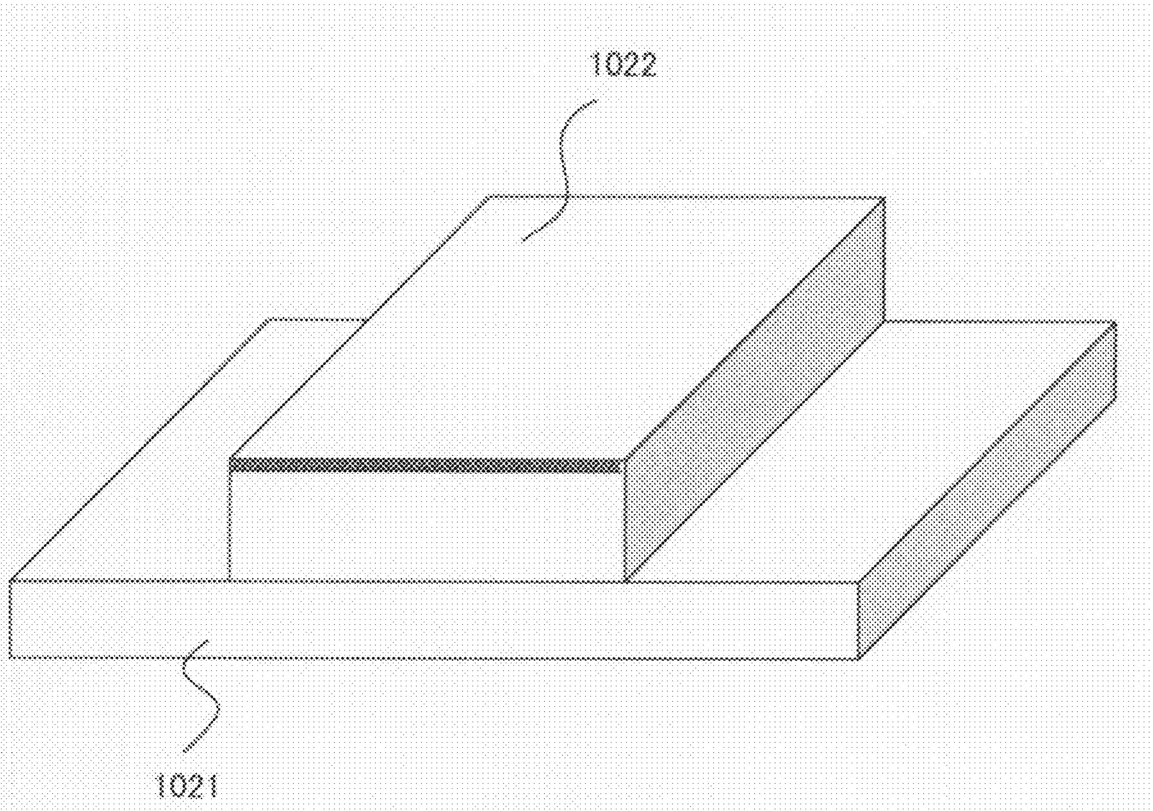
FIG. 7 is a perspective view of an acoustic matching layer/piezoelectric device mounting step.
Figure 8:
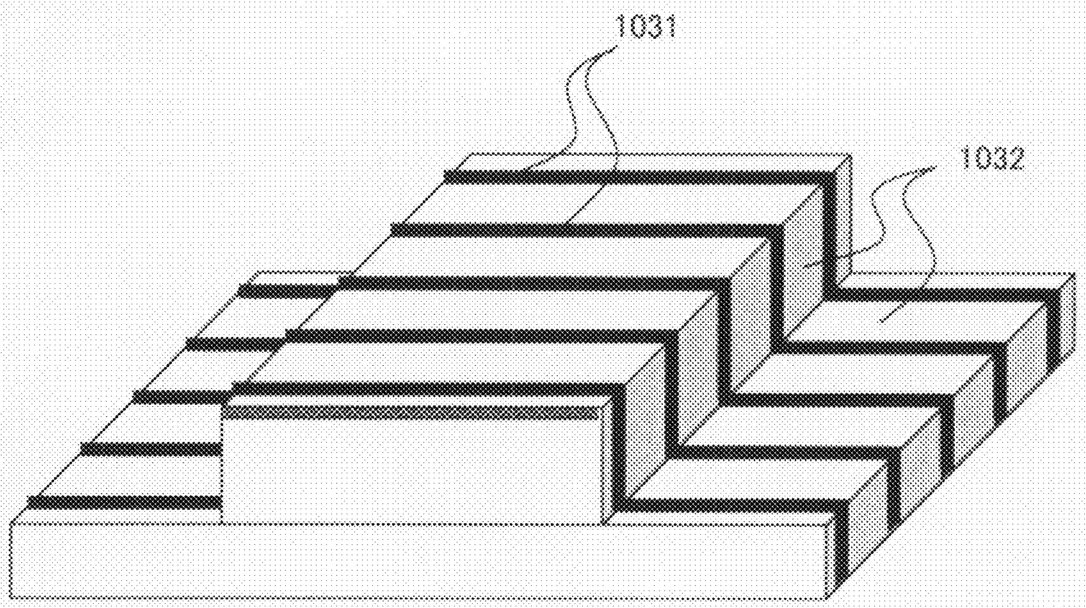
FIG. 8 is a perspective view of the first division step.
Figure 9:
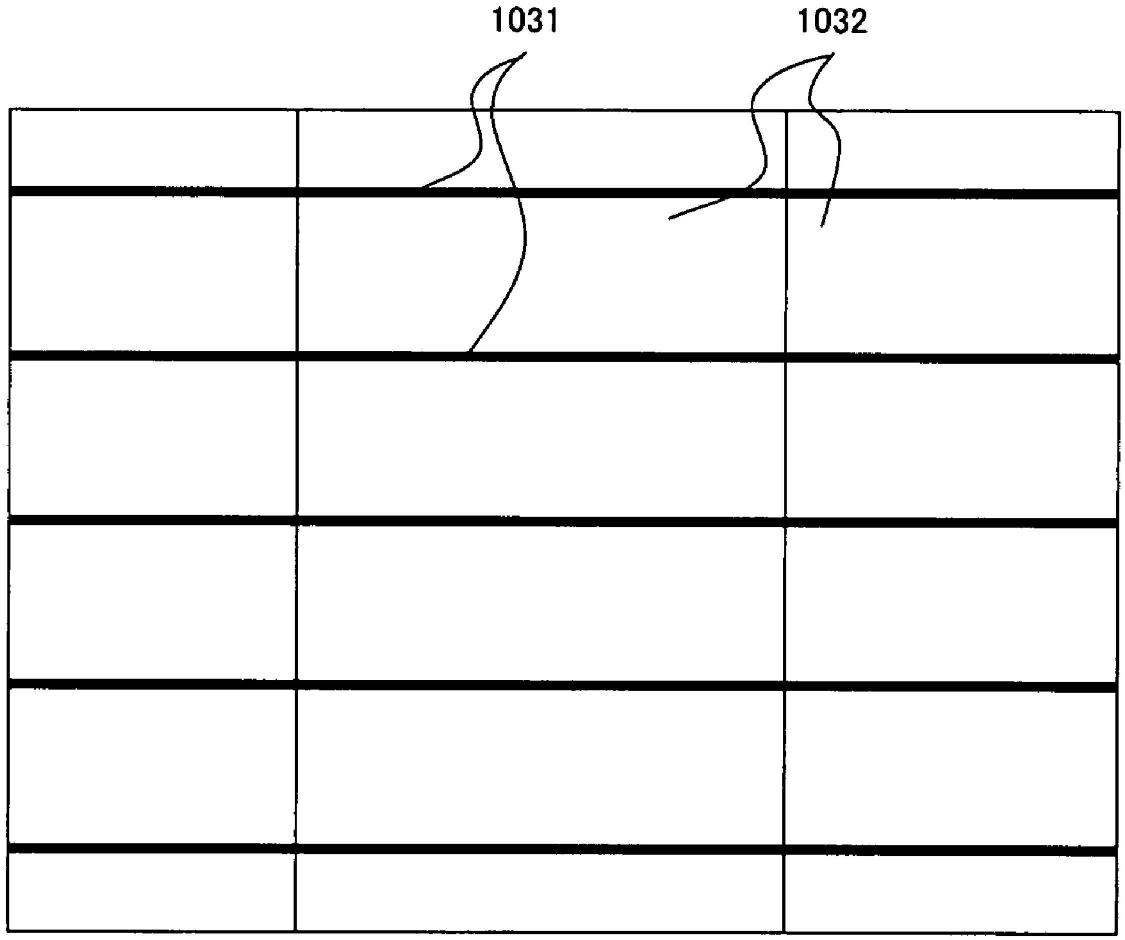
FIG. 9 is a top view of the first division step.
Figure 10:
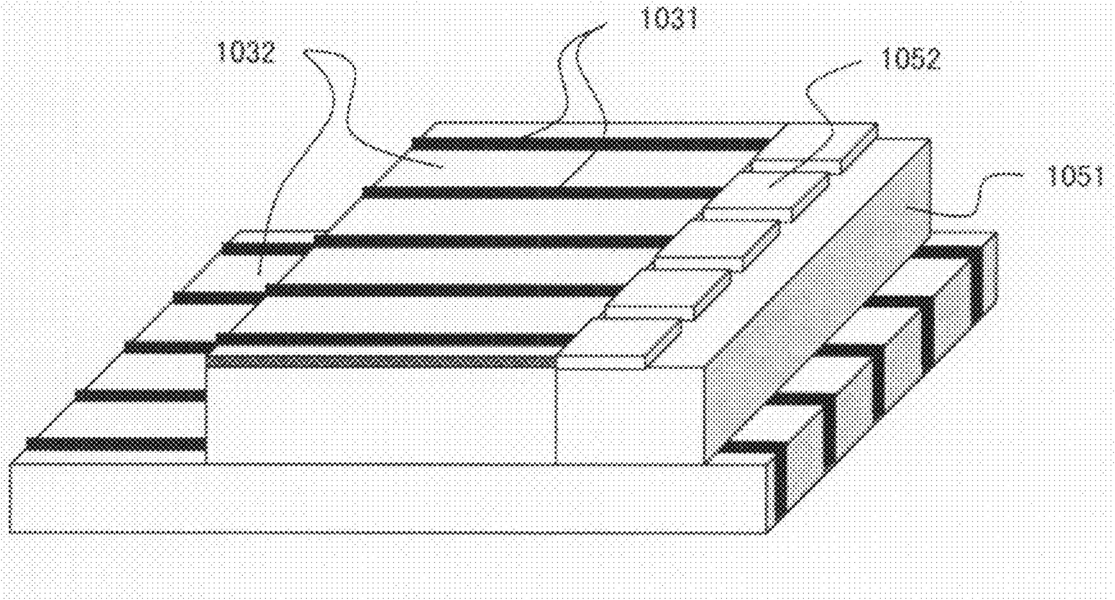
FIG. 10 is a perspective view of the piezoelectric/board mounting step.
Figure 11:
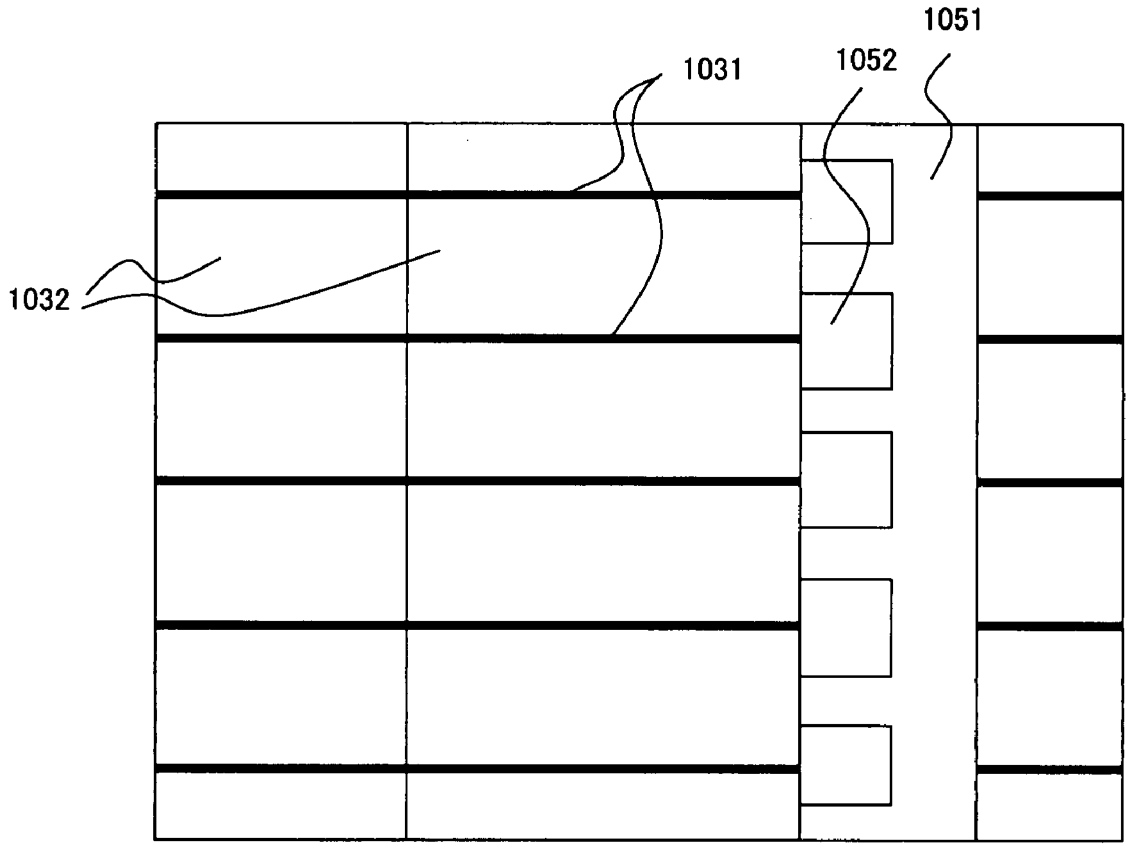
FIG. 11 is a top view of the piezoelectric device/board mounting step.
Figure 12:
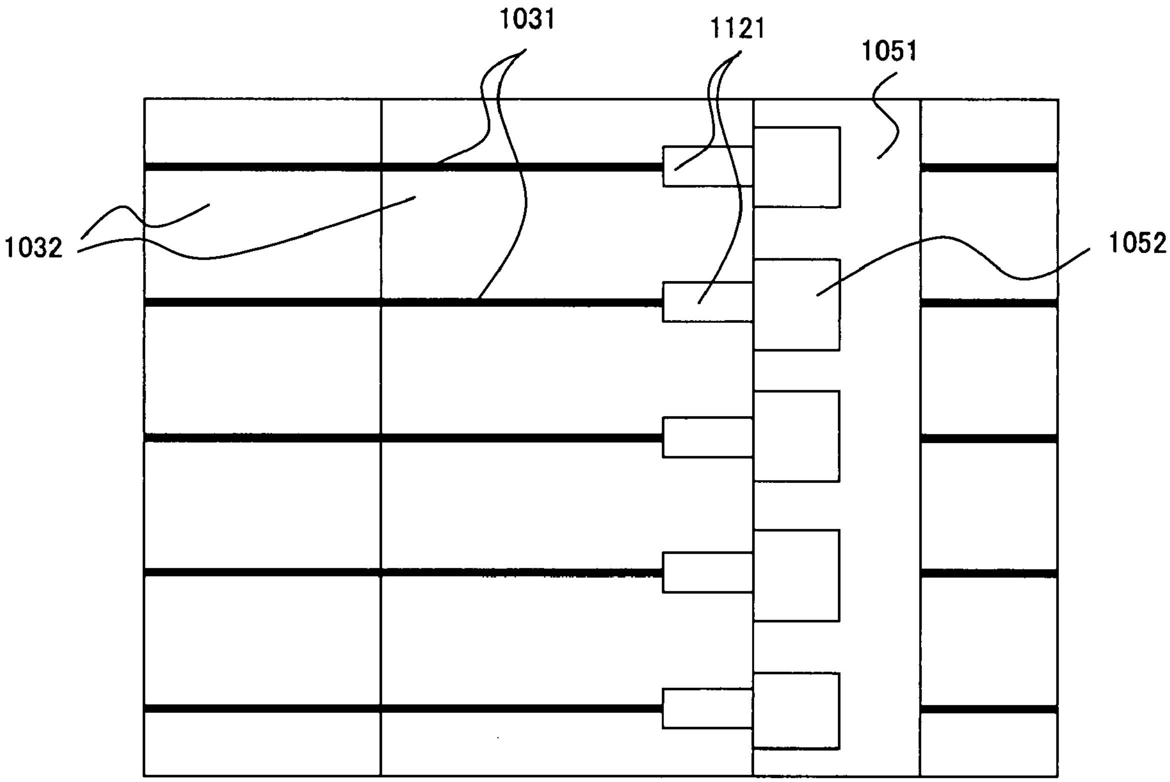
FIG. 12 is a perspective view of the masking step.
Figure 13:
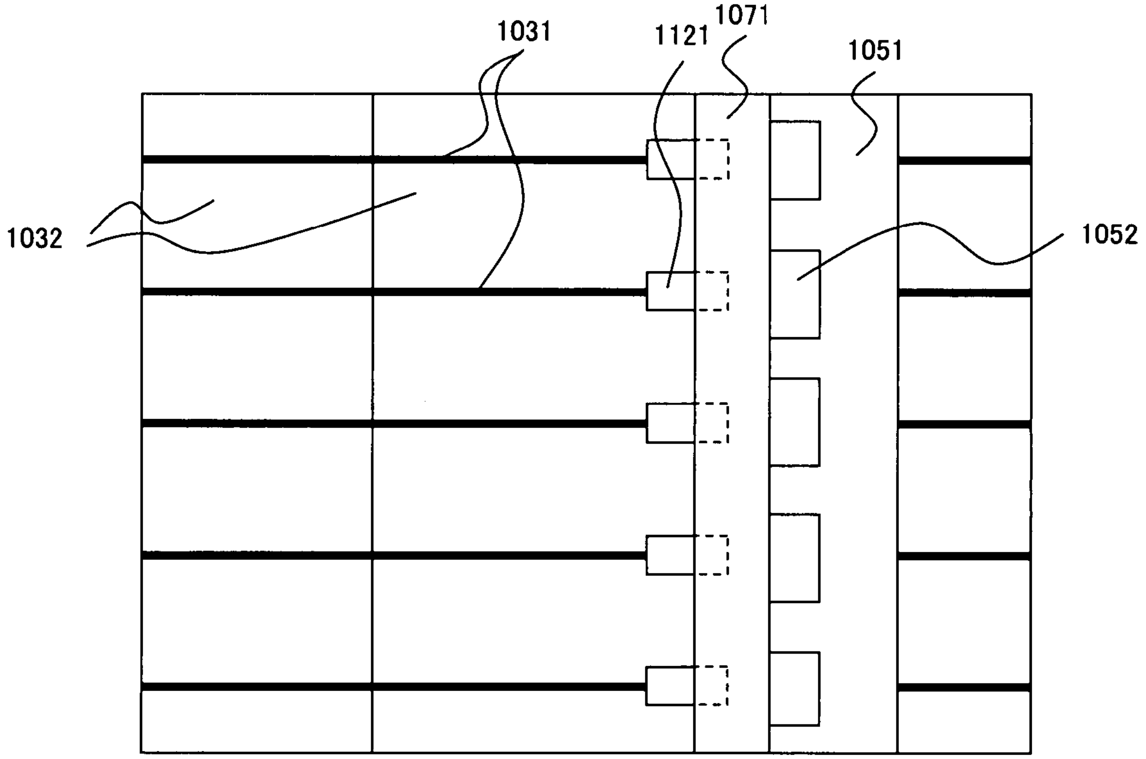
FIG. 13 is a top view of the conductive sheet coating step in the first embodiment.
Figure 14:
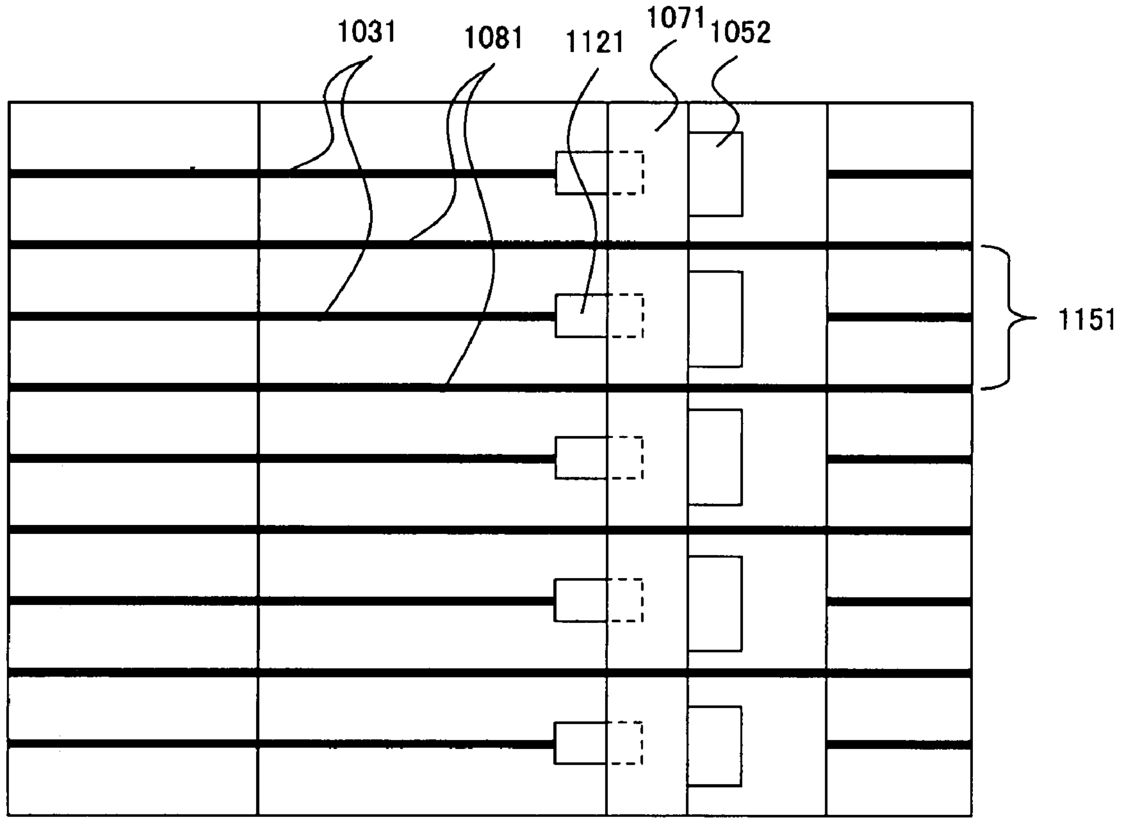
FIG. 14 is a top view of the second division step in the first embodiment.
Figure 15:
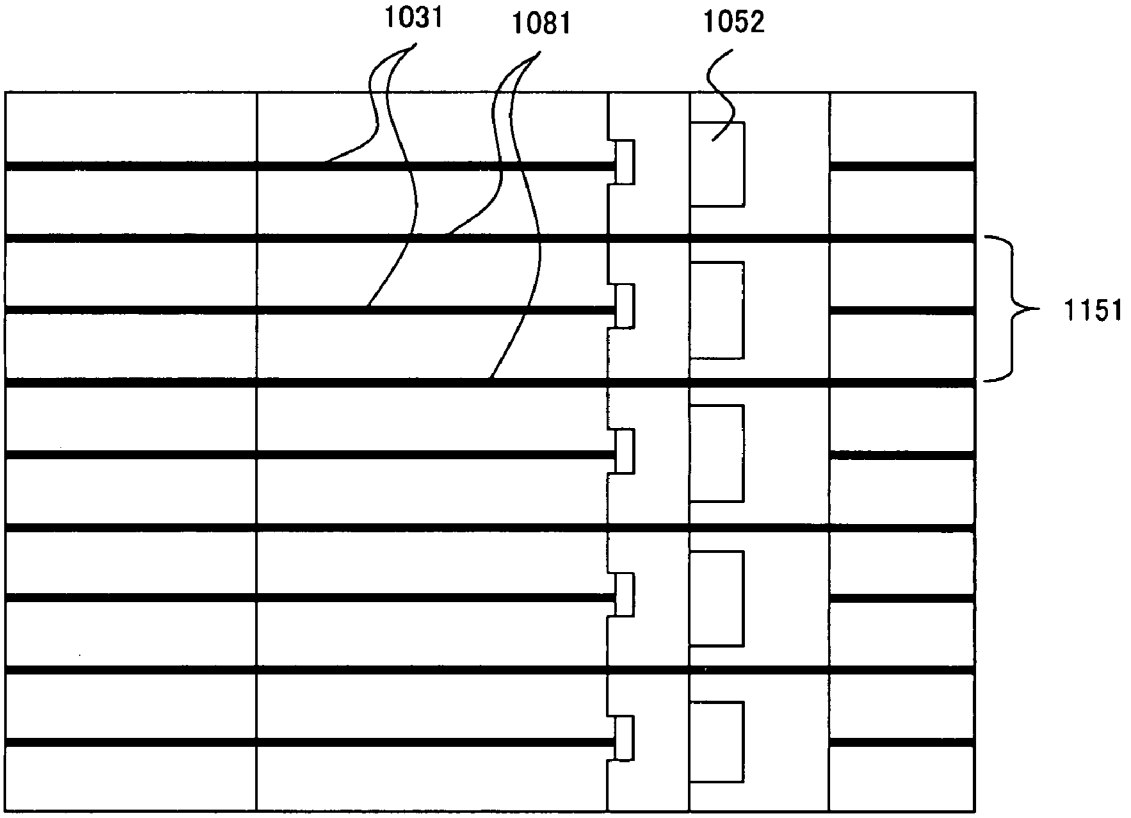
FIG. 15 is a top view of the step after a masking member is removed.

FIG. 6 is a flowchart showing a method of manufacturing an ultrasonic transducer according to the first embodiment. FIG. 7 is a perspective view of the acoustic matching layer/piezoelectric device mounting step. FIG. 8 is a perspective view of the first division step. FIG. 9 is a top view of the first division step. FIG. 10 is a perspective view of the piezoelectric device/board mounting step. FIG. 11 is a top view of the piezoelectric device/board mounting step. FIG. 12 is a perspective view of the masking step. FIG. 13 is a top view of the conductive sheet coating step in the first embodiment. FIG. 14 is a top view of the second division step in the first embodiment. FIG. 15 is a top view of the step after a masking member is removed.

First, in the acoustic matching layer/piezoelectric device mounting step executed in step S11 shown in FIG. 6, an acoustic matching layer 1021 is connected to a piezoelectric device 1022 as shown in FIG. 7. On the piezoelectric device 1022, electrodes such as a piezoelectric device emitting surface electrode (an electrode to which a ground wire is connected) and a piezoelectric device back surface electrode (an electrode to which a drive wire is connected) are formed by using, for example, a silver firing method.

In the first division step executed in step s12 shown in FIG. 6, on the acoustic matching layer 1021 and the piezoelectric device 1022 that were connected to each other, first dicing grooves 1031 are formed at a certain pitch by using a dicing machine, as shown in FIGS. 8 and 9. Thereby, the acoustic matching layer 1021 and the piezoelectric device 1022 in a connected state are divided into a plurality of piezoelectric devices 1032.

Then, in the piezoelectric device/board mounting step executed in step s13 shown in FIG. 6, the respective piezoelectric devices 1032 obtained through the first division step in step s12 are connected to a circuit board 1051 to which conveyance cables and other circuit boards such as FPC boards are connected, as shown in FIGS. 10 and 11. The communication cables and other circuit boards are used for sending drive signals used for transmitting ultrasound or for accepting reception signals that are created on the basis of ultrasound received. A three-dimensional circuit board, an alumina board, a glass epoxy board, a rigid/flexible board, an FPC board or the like can be employed as the circuit board 1051. On the circuit board 1051, electrode patterns 1052 are formed at a certain pitch (the pitch corresponding to the arraying pitch of transducer elements 1082 that will be explained later). Also, it is possible for the electrode patterns to be formed only on the upper surface of the circuit board 1051, or to be formed in such a manner that the patterns cover the lower surface, the side surfaces, and the upper surfaces of the circuit board 1051. In FIG. 10, the conductive surface of the circuit board 1051 is approximately at the same level as the conductive surfaces of the respective piezoelectric devices 1032. However, when conductive resin, a conductive thin sheet, a thin metallic foil (about eight micrometers, for example) or a flexible printed circuit board using such materials is employed, the level of the conductive surface of the circuit board 1051 and that of the respective piezoelectric device 1032 can be different from each other by several tens of micrometers, and it does not make a difference which is higher.

Next, in the masking step executed in step S14 shown in FIG. 6, the portions on the respective piezoelectric devices 1032 that have been connected to the circuit board 1051 in the piezoelectric device/board mounting step executed in step S13 are masked with masking members 1121 in such a manner that the first dicing grooves 1031 that have been formed in the division step executed in step s12 are not masked, as shown in FIG. 12. As the masking member 1121, printing screens such as, for example, a metallic mask or a mesh mask; plates made of metal such as stainless steel, steel, nickel, or bronze; tapes using, as the substrate, resins such as polyimide PTFE (polytetrafluoroethylene), PET (polyethylene terephthalate), or the like; and materials such as PET, fused quartz, ceramics, FRP (fiber reinforced plastic) or the like can be employed.

Next, in the conductive sheet coating step executed in step s15 shown in FIG. 6, the portions that are close to the mounting portions between the piezoelectric devices 1032 and the circuit board 1051 that have been connected to each other in the piezoelectric device/board mounting step executed in step s13, and that are close to the portions that have been masked with the masking members 1121 in step s14 are coated, as shown in FIG. 13, with a conductive sheet 1071 made of a conductive thick sheet or of a conductive thin sheet.

In the second division step executed in step s16 shown in FIG. 6 (after forming the conductive sheet 1071), second dicing grooves 1081 are formed, by using a dicing machine, at a certain pitch on the respective piezoelectric devices 1032 and the circuit board 1051, which are coated with the conductive sheet 1071 in the conductive sheet coating step executed in step s15 between the first dicing grooves 1031 formed in the first division step executed in step s12 and on the acoustic matching layer 1021, and thereby a plurality of transducer elements 1151 are formed as shown in FIG. 14.

In the masking member removal step executed in step s17 shown in FIG. 6, the masking members 1121 are removed, and thereby the ultrasonic transducer comprising a plurality of transducer elements 1151 each consisting of two transducer sub elements can be manufactured.

Next, a second embodiment to which the present invention is applied is explained by referring to FIGS. 16 through 20. The points that are different from the first embodiments are mainly described, and explanations of the points that are similar between the first and second embodiments are omitted.

Figure 16:
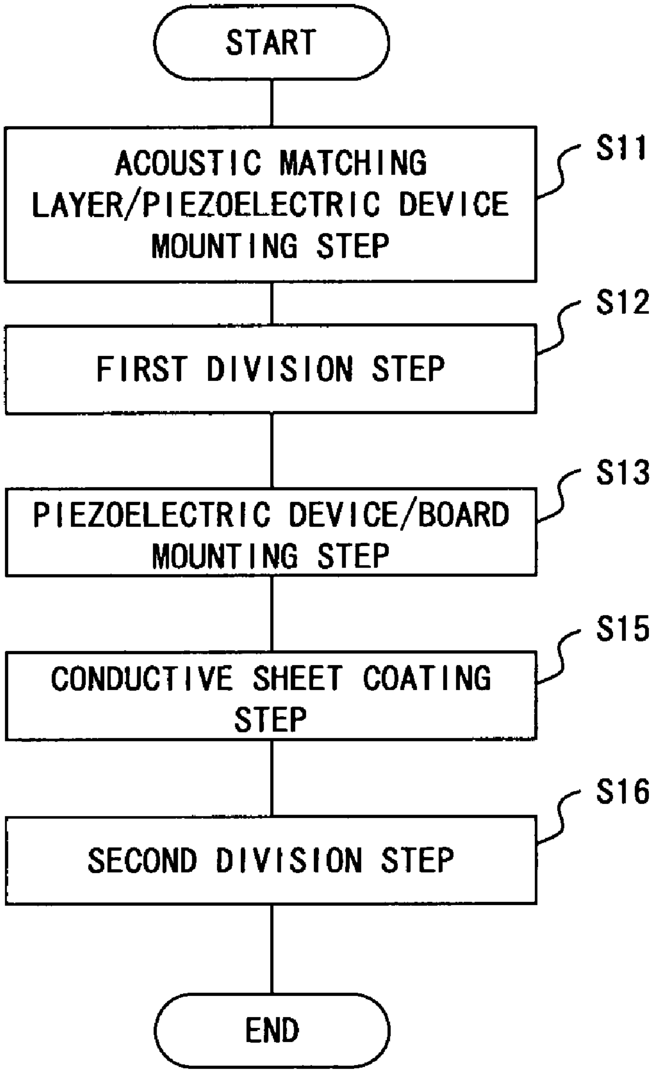
FIG. 16 is a flowchart of a method of manufacturing an ultrasonic transducer according to a second embodiment.
Figure 17:
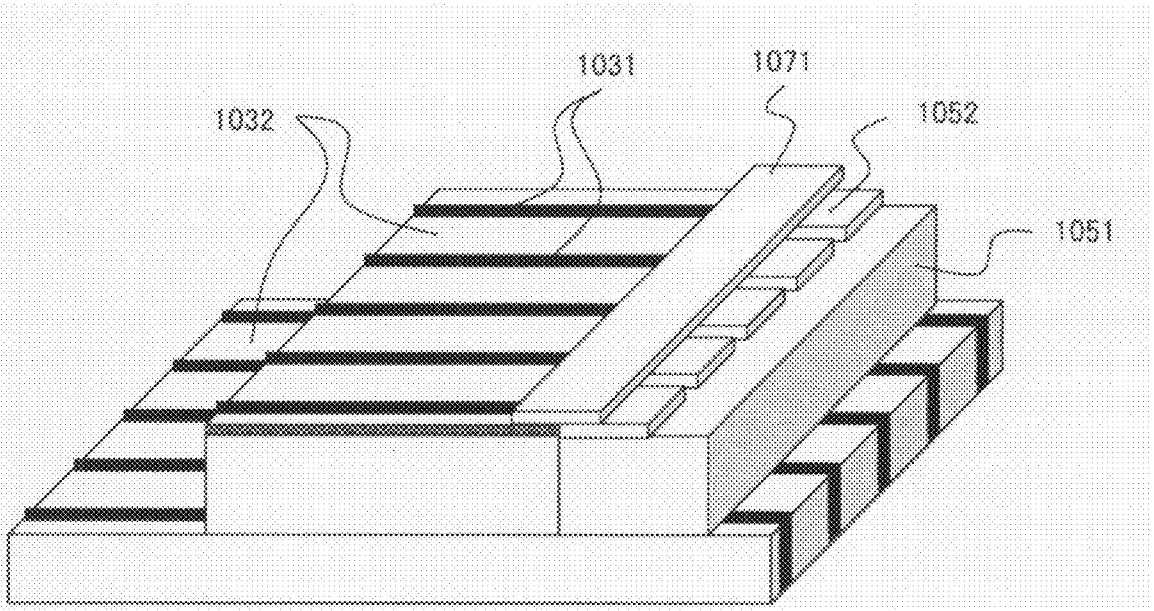
FIG. 17 is a perspective view of the conductive sheet coating step in the second embodiment.
Figure 18:
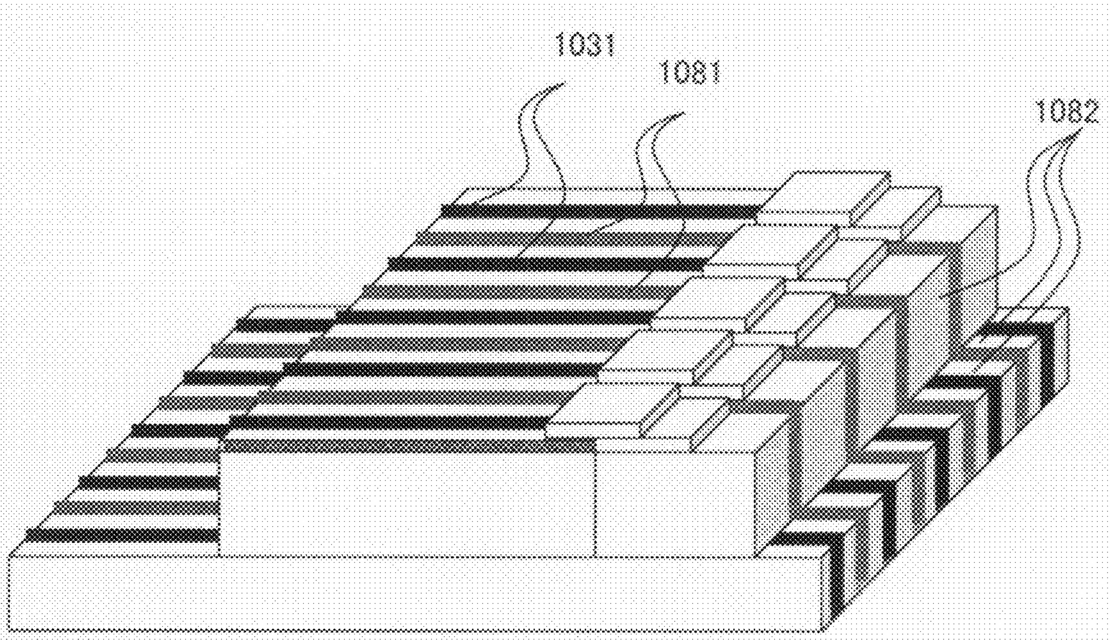
FIG. 18 is a perspective view of the second division step in the second embodiment.
Figure 19:
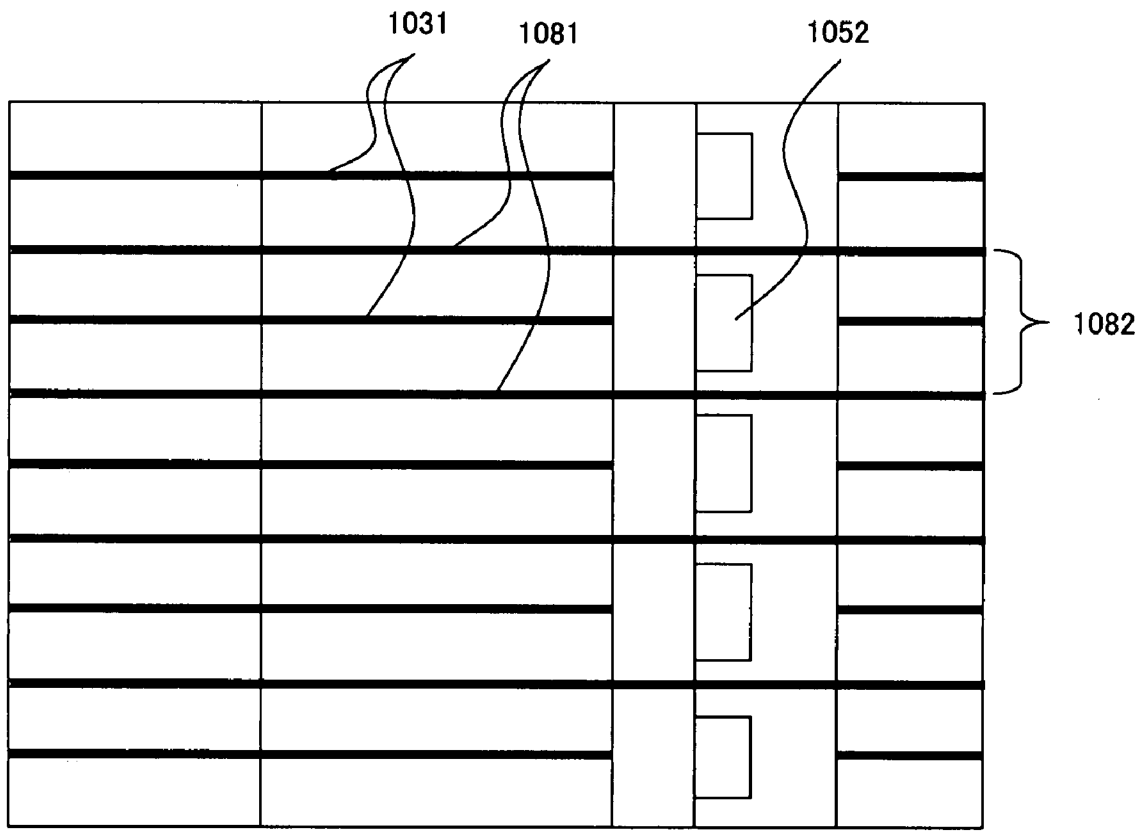
FIG. 19 is a top view of the second division step in the second embodiment.
Figure 20:
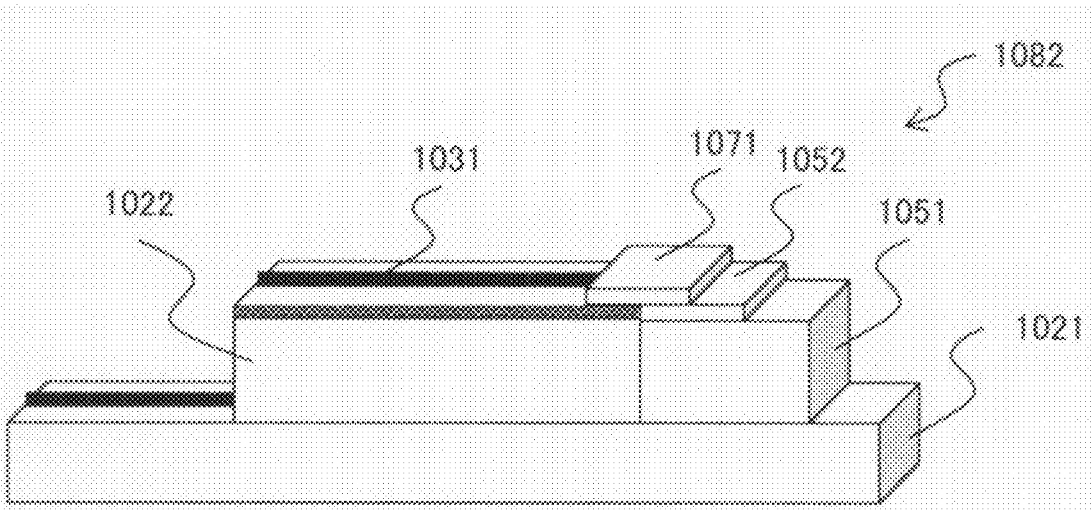
FIG. 20 is a perspective view of one transducer element.

FIG. 16 is a flowchart showing a method of manufacturing an ultrasonic transducer according to the second embodiment. FIG. 17 is a perspective view showing the conductive sheet coating step in the second embodiment. FIG. 18 is a perspective view showing the second division step in the second embodiment. FIG. 19 is a top view showing the second division step in the second embodiment. FIG. 20 is a perspective view showing one transducer element.

The flowchart shown in FIG. 16 is different from that shown in FIG. 6 in that the flowchart shown in FIG. 16 does not include the masking step executed in step 14 or the masking member removal step executed in step s17, both of which are shown in FIG. 6. In other words, the method of manufacturing an ultrasonic transducer according to the second embodiment is characterized by not requiring the masking step.

Specifically, in the conductive sheet coating step executed in step S15 that is executed subsequently to the piezoelectric device/board mounting step executed in step s13, portions that are close to the mounting portions between the piezoelectric devices 1032 and the circuit board 1051 that were connected to each other in the piezoelectric device/board mounting step executed in step s13 are coated with the conductive sheet 1071 in such a manner that the conductive sheet 1071 covers the portions on both piezoelectric device 1032 and circuit board 1051. The conductive sheet 1071 can be made of a conductive thin sheet that is fabricated by using a conductive sheet made of conductive paint, conductive resin, conductive adhesive or the like, or a conductive thin sheet obtained by plating, sputtering, vapor deposition, CVD (chemical vapor deposition) or the like.

When the conductive sheet 1071 is hardened, then in the second division step executed in step s16 shown in FIG. 16 the second dicing grooves 1081 are formed, by using a dicing machine, at a certain pitch on the respective piezoelectric devices 1032 and the circuit board 1051, which are coated with the conductive sheet 1071 in the conductive sheet coating step executed in step s15 and are between the first dicing grooves 1031 formed in the first division step executed in step s12 and on the acoustic matching layer 1021, and thereby a plurality of transducer elements 1082 are formed, as shown in FIGS. 18 and 19.

Thereby, an ultrasonic transducer can be manufactured, that comprising a plurality of transducer elements 1082 each of which consists of two transducer sub elements connected to one communication cable (not shown) for sending drive signals used for transmitting ultrasound or accepting reception signals created on the basis of ultrasound received.

FIG. 20 is a perspective view of one transducer element.

FIG. 20 shows one of the transducer elements 1082 that is obtained through the second division step executed in step s16 shown in FIG. 16; the transducer element 1082 consists of the acoustic matching layer 1021, the piezoelectric device 1022, the circuit board 1051 with the electrode pattern 1052, and the conductive sheet 1071 in their divided states. Also, the transducer element 1082 consists of two piezoelectric sub elements between which there is the first dicing trench 1031.

Additionally, when a conductive adhesive or conductive paint having a viscosity of 3000 cps or higher is employed and the width of each first dicing trench 1031 is 100 micrometers or smaller, it is not necessary to cover the first dicing grooves 1031 because the conductive sheet 1071 rarely flows into the first dicing grooves 1031. In particular, if the conductive sheet 1071 is fabricated on the basis of a printing method by using a conductive adhesive or a conductive paint having a thixotropic characteristic, it is possible to securely prevent the conductive sheet 1071 from flowing into the first dicing grooves 1031.

The first and second embodiments have been explained by referring to the drawings; however, the scope of the present invention is not limited to the above embodiments, and various alterations, modifications and the like are allowed without departing from the spirit of the present invention.

For example, although in the embodiments described above the transducer elements each consisting of two transducer sub elements has been explained, each transducer element can consist of three or more transducer sub elements.

Also, the material of the piezoelectric device is not limited to silver, and electrodes fabricated by sputtering, vapor deposition, CVD, plating or the like with a metallic material such as gold, chrome, copper, nickel or the like can be used.

Similarly, the method of masking is not limited to the above methods of masking in the drawings as long as the function of covering the portions at which the conductive sheet on the first dicing grooves is formed is achieved. For example, a method of masking in which the masking is in the form of the teeth of a comb can be applied to masking for printing or for thin sheets.

Similarly, although the piezoelectric device plate and the board are mounted on the acoustic matching layer in the above embodiments, the same steps and configurations can be employed even when the piezoelectric device and the board are mounted on a member that is not the acoustic matching member, such as, for example, a backing material that is another representative acoustic member or temporary fixation plates that are to be removed when manufacturing is completed.

According to the present invention, the degree of freedom in the setting of positions of connection with lead wire terminals is high even when the width of each transducer sub elements is small; thus it is possible to facilitate the manufacture of ultrasonic transducers.

According to the present invention, all the transducer sub elements can be in connected states by connecting the lead wires for each transducer element in a lump; accordingly, it is possible to facilitate the manufacture of ultrasonic transducers.

Also, according to the present invention, a thin sheet or a thick sheet (conductive sheet) made of conductive resin is used for lead wires; accordingly, it is possible to manufacture an ultrasonic transducer having a reduced space for wiring.

Also, according to the present invention, because there is no residual stress such as bending stress or the like, it is possible to manufacture an ultrasonic transducer having a high reliability.

Next, the third embodiment of the present invention will be explained.

Figure 21:
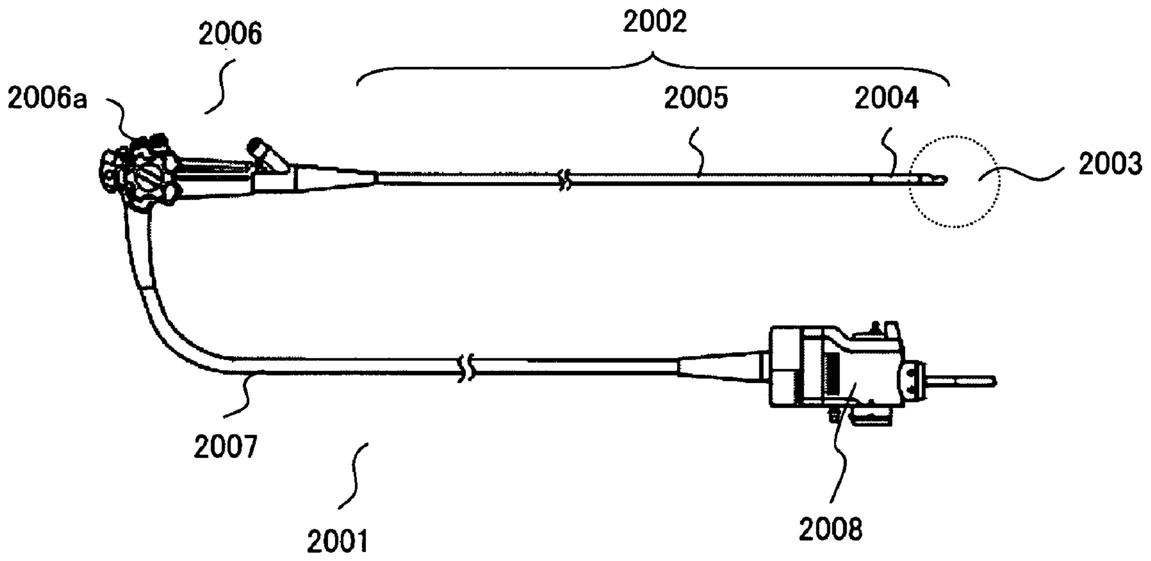
FIG. 21 shows an outline of an ultrasound endoscope.

FIG. 21 shows an outline of an ultrasound endoscope according to the third embodiment of the present invention.

An ultrasound endoscope 2001 comprises an operation unit 2006 at the proximal end of an insertion unit 2002. A universal cord 2007 extends from a side portion of the operation unit 2006. The universal cord 2007 comprises, at one end thereof, a scope connector 2008 that is to be connected to a light source (not shown). Further, the scope connector 2008 is connected to an ultrasonic observation device (not shown) via a cable.

The insertion unit 2002 comprises a distal end 2003, a bending unit 2004 that can arbitrarily curve, and a flexible tube 2005, in this order from the distal end side and in the connected state. The operation unit 2006 comprises an angulation control knob 2006*a*, and by operating this angulation control knob 2006*a*, the bending unit 2004 can be curved.

Figure 22:
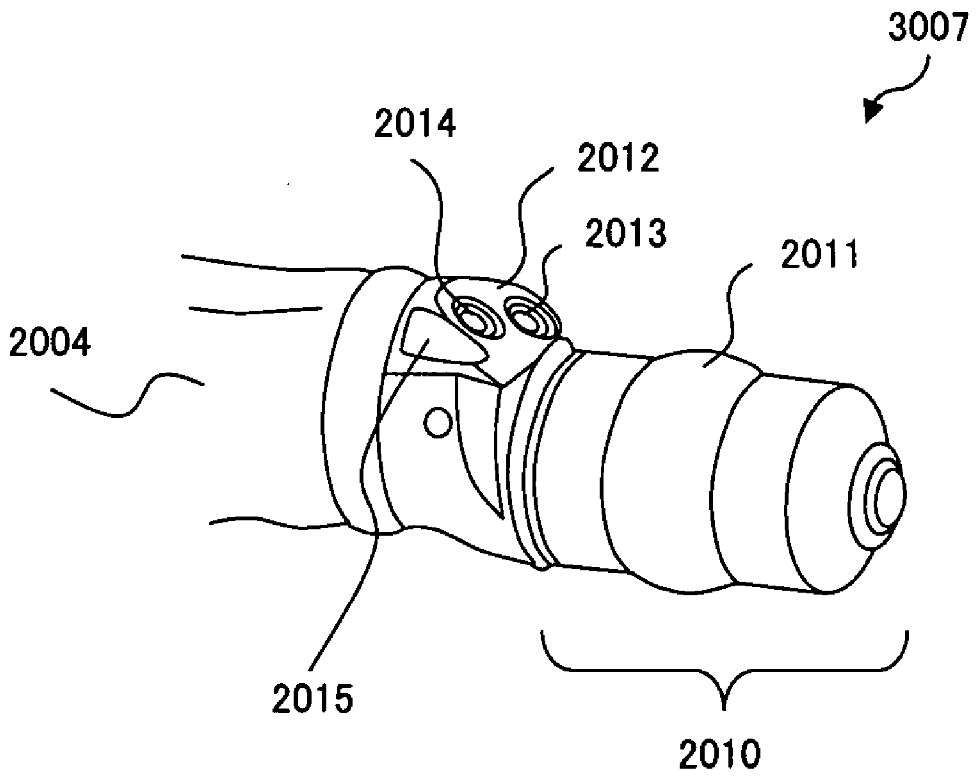
FIG. 22 is an enlarged view of a distal end 2003 in the ultrasound endoscope 2001 shown in FIG. 21.

FIG. 22 is an enlarged view showing the distal end 2003 in the ultrasound endoscope 2001 shown in FIG. 21.

The distal end 2003 comprises an ultrasonic transducer 2010 and comprises a slanting surface portion 2012 between the bending unit 2004 and the ultrasonic transducer 2010. The ultrasonic transducer 2010 is coated with a material from which an acoustic lens (ultrasonic wave transmitting and receiving unit) 2011 is formed. The slanting surface portion 2012 comprises a lighting lens cover 2013 that constitutes a lighting optical unit for casting illumination light to observation target sites, an objective lens cover 2014 that constitutes an optical observation unit that captures the optical images of the observation target sites, and an instrument channel outlet 2015 from which a treatment tool is drawn out. Because the diameter of the endoscope is 20 mm at most, the radius of the outer periphery of the ultrasonic transducer 2010 mounted on the endoscope has to be 10 mm or smaller.

Figure 23:
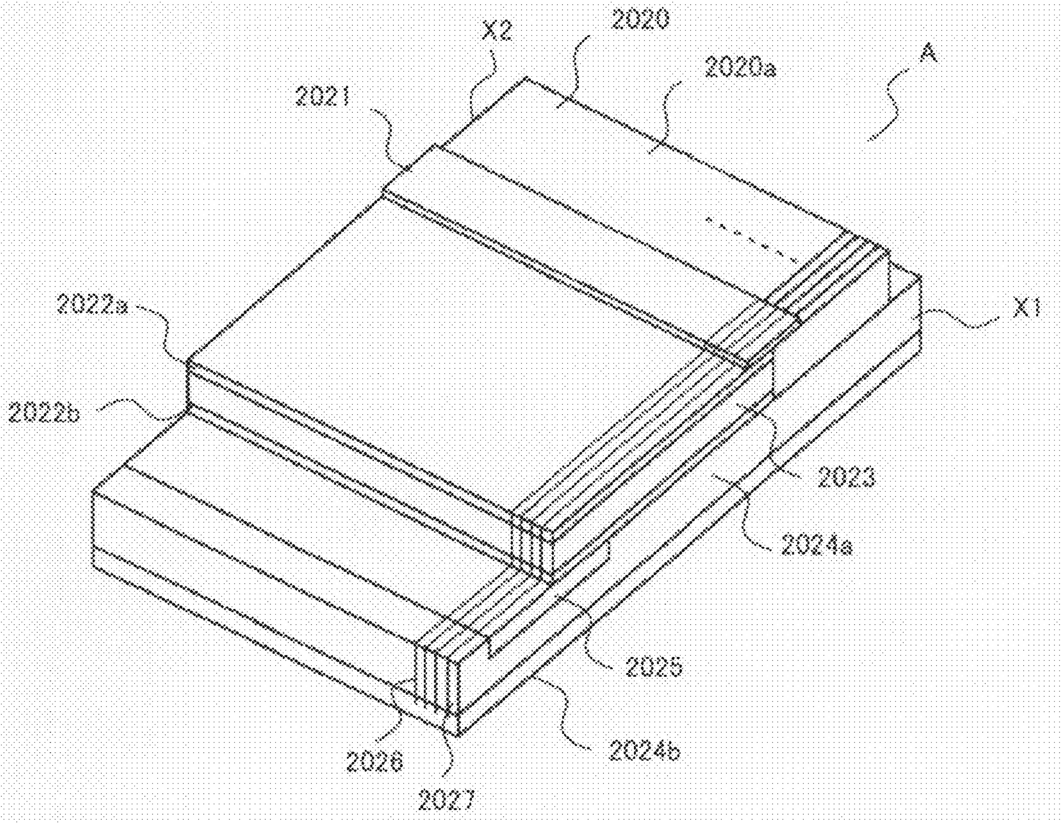
FIG. 23 is a perspective view of the manufacturing process of a structure that constitutes an ultrasonic transducer.

FIG. 23 is a perspective view showing a structure that constitutes an ultrasonic transducer in the manufacturing process.

In FIG. 23, when the ultrasonic transducer is to be formed, a structure, A, is first fabricated; structure A comprises a wiring board 2020, an electric conductor 2021, electrodes 2022 (2022*a* and 2022*b*), piezoelectric transducers 2023, acoustic matching layers 2024 (first acoustic matching layer 2024*a* and second acoustic matching layer 2024*b*), a GND conductive unit 2025, and grooves 2026. Herein below, the fabrication of structure A is explained.

First, the first acoustic matching layer 2024*a* is formed after the second acoustic matching layer 2024*b* is formed. Next, grooves are formed on the first acoustic matching layer 2024*a* by using, for example, a dicing saw (a precision cutting machine), and the GND conductive unit 2025 is formed by casting conductive resin into the grooves. Next, the piezoelectric transducer 2023 having the electrode layers 2022*a* and 2022*b* formed on its opposing surfaces is connected to the piezoelectric transducer 2023. Next, the wiring board 2020 is attached to the first acoustic matching layer 2024*a* in such a manner that the attached wiring board 2020 is adjacent to the piezoelectric transducer 2023. On the surface of the wiring board 2020, the electrode layer 2020*a* is formed. Then, the electric conductor 2021 is attached to the wiring board 2020 and the piezoelectric transducer 2023 in order to cause the electrode layer 2020*a* and the electrode 2022*a* to be electrically conductive to each other.

Slots are formed on structure A by using a dicing saw such that a plurality of grooves (dicing grooves) 2026 each having a width of several tens of micrometers at a constant interval are formed. The width of these grooves is desirably in the range of 20 micrometers through 50 micrometers. The above slots are formed in such a manner that only the second acoustic matching layer 2024*b* is not completely cut such that portions each having a thickness of several tens of micrometers remain uncut.

Thereafter, processes that are in accordance with types (such as the convex type, the radial type, and the like) of the ultrasonic transducer are performed. In the case of, for example, FIG. 22, the ultrasonic transducer shown is of the electronic radial scanning type; accordingly, structure A is formed into a cylindrical shape such that the sides X1 and X2 thereof face each other.

Figure 24:
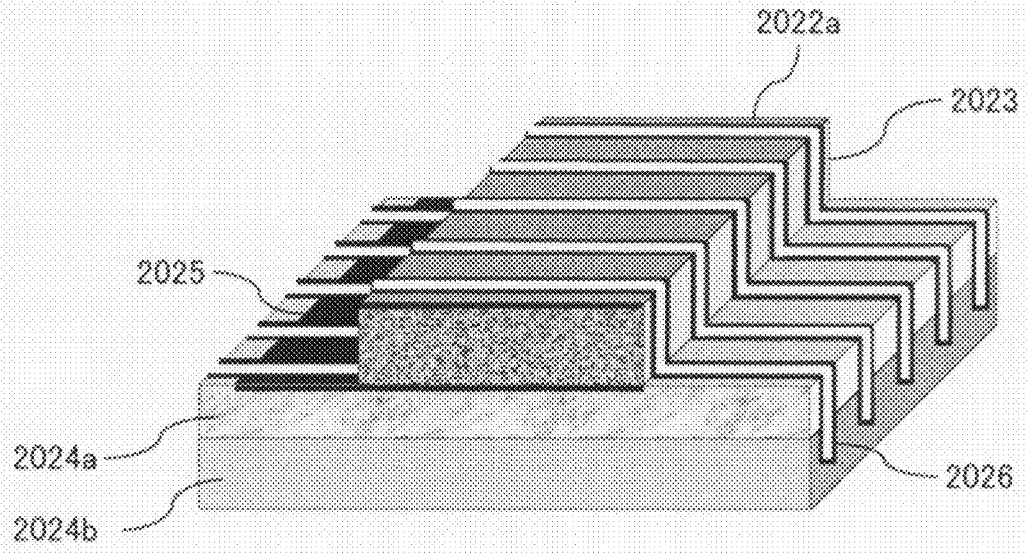
FIG. 24 is a perspective view showing structure A in the third embodiment of the present invention.
Figure 25:
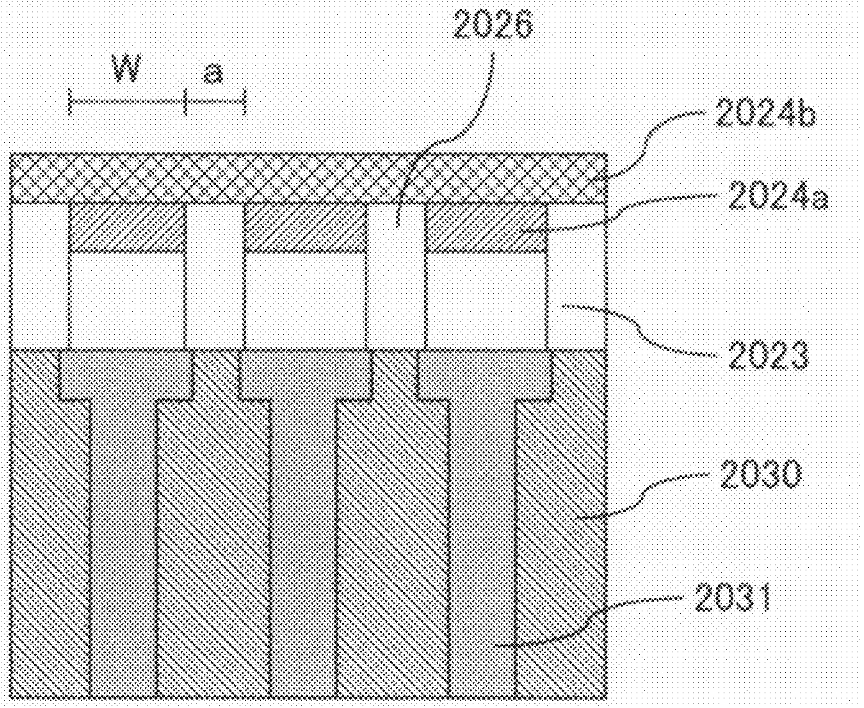
FIG. 25 is a cross-sectional view showing structure A in the third embodiment.

FIG. 24 is a perspective view showing structure in the third embodiment of the present invention. FIG. 25 is a cross-sectional view showing structure A in the third embodiment of the present invention.

FIG. 24 shows structure A from FIG. 23 in a simplified manner, which comprises the piezoelectric transducer 2023 having the electrode layers 2022 formed on its opposing surfaces, the acoustic matching layer 2024 (first acoustic matching layer 2024*a* and second acoustic matching layer 2024*b*) formed on the lower surface of the piezoelectric transducer 2023, the GND conductive unit 2025 formed of conductive resin so as to be able to connect to the GND the electrode 2022*b* formed on the lower surface of the piezoelectric transducer 2023, and the grooves 2026 formed by a dicing saw (a precision cutting machine) or the like in order to form a plurality of piezoelectric transducers 2023.

FIG. 25 is a cross-sectional view of a structure, B, having the configuration in which lead wires 2031 are connected to the electrodes 2022*a* that are on the upper surface of the piezoelectric transducer 2023, and a backing material 2030 is formed in structure A. In FIG. 25, it is assumed that the width of each of the ultrasonic transducers (ultrasonic transducer elements) is W, and the interval between the adjacent transducer elements is "a". As already described, the narrower the interval "a" is, the better the display quality is. Accordingly, it is desirable that the arraying pitch "a" of these transducer elements be equal to or smaller than the wavelength $\lambda$ of the ultrasonic wave. In the third embodiment of the present invention, it is assumed that W:a=2:1 where W is 100 μm, a is 50 μm, and the length L is 5 mm. At this interval, two hundred transducer elements are arrayed in a cylindrical shape.

As already described, the lower the W/t ratio, the higher the efficiency in the coefficient of electromechanical coupling, and thus the W/t is desired to be a slow as possible. Further, when the compatibility with the observation device connected is taken into consideration, it is ideal that the piezoelectric transducers used for the ultrasonic transducer yield an impedance, in the employed frequency domain, that is around the characteristic impedance (50Ω for example) of the cables connected to the transducers. Accordingly, the impedance in the case when the material PZT-5 disclosed in Patent Document 2 is employed and the impedance leading to 50Ω are calculated.

When the dielectric constant $\epsilon_{33}^T/\epsilon_0$ of PZT-5 is assumed to be 1700, the result shown in FIG. 26 is obtained. In the frequency domain used in the third embodiment, the calculation is performed on the assumption that f=7.5 MHz, and the impedance Z=1/2πfC.

$\epsilon_{33}^T/\epsilon_0$=1700 represents the case when PZT-5 disclosed in Patent Document 2 is employed, and the capacitance C is fixed to be 75.259 [pF] from height t=0.2 [mm], width W=0.1 [mm], and length L=10 [mm]. In this case, the impedance Z=282.0 [ohm].

Next, when a material with $\epsilon_{33T}/\epsilon_0$=1700 is used, the capacitance C=110.675 [pF] is obtained from height t=0.2 [mm], width W=0.1 [mm], and length L=10 [mm], and in this case the impedance Z=191.7 [ohm].

Alternatively, if a material with $\epsilon_{33}^T/\epsilon_0$=8000 is used, the capacitance C=354.16 [pF] is obtained from height t=0.2 [mm], width W=0.1 [mm], and length L=10 [mm]. In this case, the impedance Z=59.9 [ohm]. However, this condition is based on the simulated ideal material, which is described herein for reference purposes.

As described above, the piezoelectric transducer used in an ultrasonic transducer to be used in body cavities has to be very small in size, and when a material with $\epsilon_{33}^T/\epsilon_0$=1000 or lower disclosed in Patent Document 2 is employed, the impedance becomes very high. Additionally, only discrete selection can be performed on the dielectric constant of the piezoelectric material. Also, machinability is required because a dicing process has to be performed with an accuracy on the order of several tens of micrometers.

It has been found that it is best if the material employed in the third embodiment is a material that is readily available, is advantageous in view of the impedance and machinability, and has a dielectric constant $\epsilon_{33}^T/\epsilon_0$ of approximately 2500.

Figure 27:
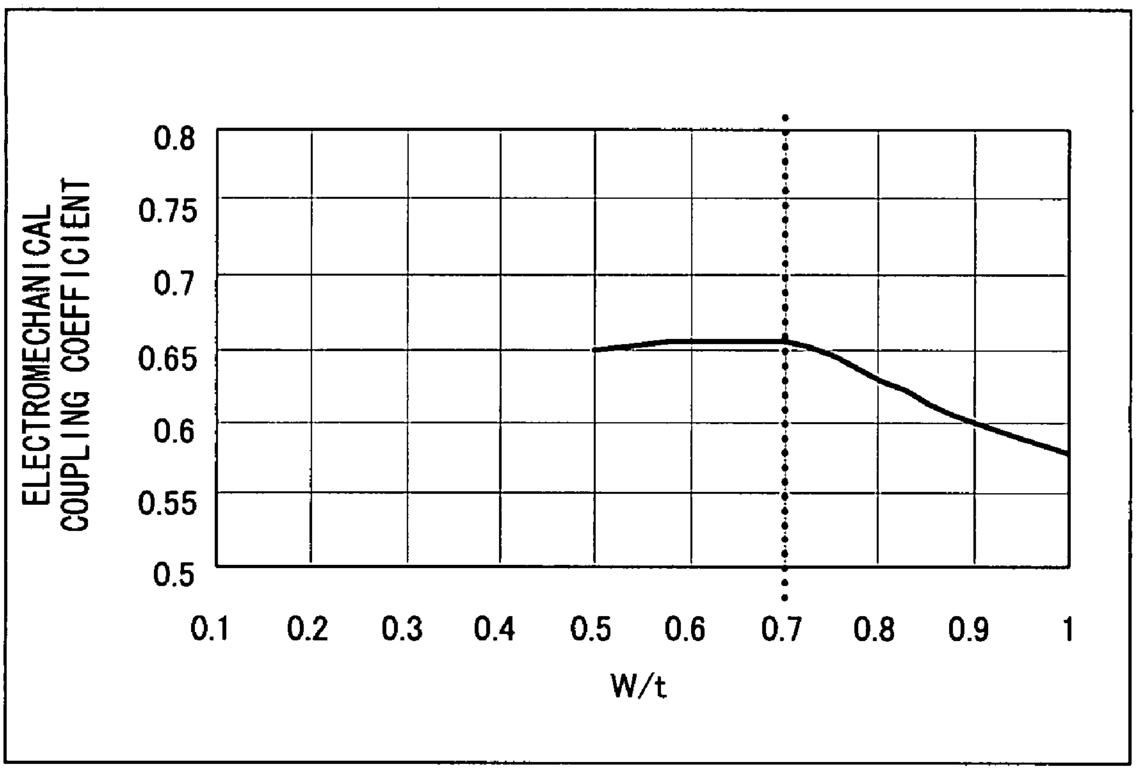
FIG. 27 shows the relationship between the W/t ratio and the electromechanical coupling coefficients in the third embodiment (in the case when $\in_{33}{}^{T}/\kappa_0$ is approximately 1500)
Figure 28:
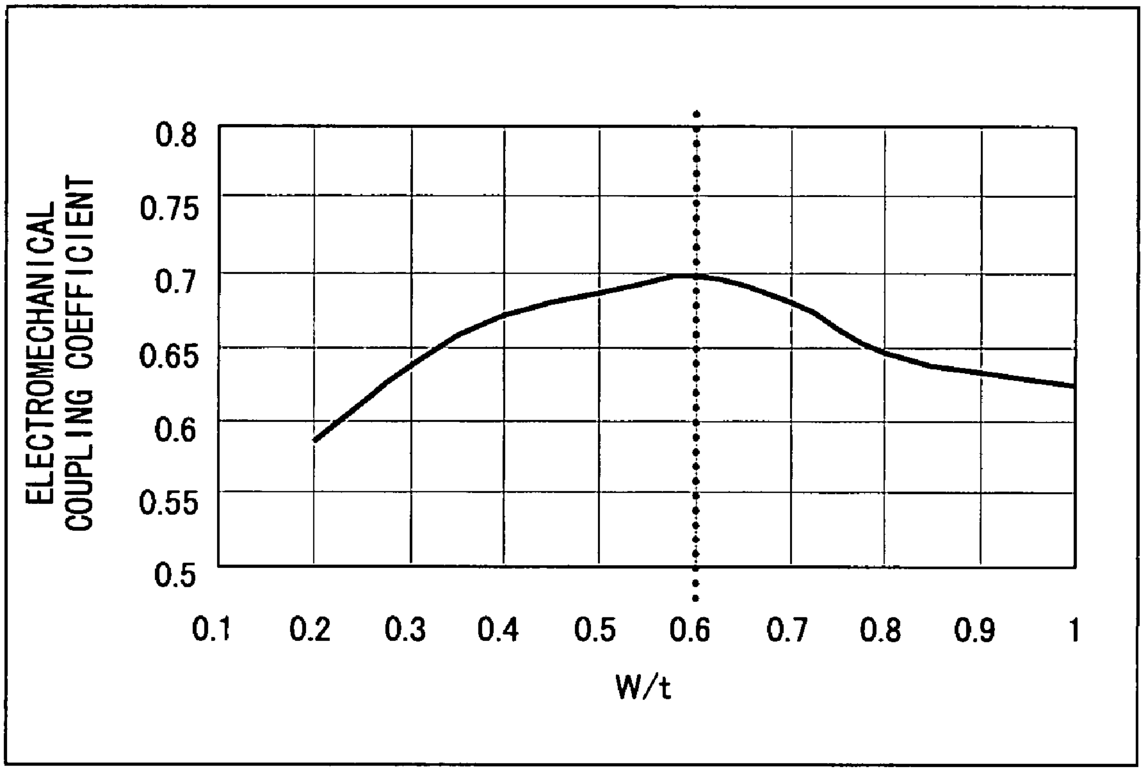
FIG. 28 shows the relationship between W/t ratio and the electromechanical coupling coefficients in the third embodiment (in the case when $\in_{33}{}^{T}/\in_0$ is approximately 2500)

FIGS. 27 and 28 respectively show relationships between the W/t ratios and the electromechanical coupling coefficients in the third embodiment. FIG. 27 shows the case when a material with a $\epsilon_{33}^T/\epsilon_0$ of approximately 1500 is used. FIG. 28 shows the case when a material with a $\epsilon_{33}^T/\epsilon_0$ of approximately 2500 is used.

In FIG. 27, the electromechanical coupling coefficient is at its peak when W/t is approximately 0.7.In FIG. 28, the electromechanical coupling coefficient is at its peak when W/t is approximately 0.6.It is understood that the higher $\epsilon_{33}^T/\epsilon_0$ is, the lower the W/t ratio is when the electromechanical coupling coefficient is at its peak.

It is known that the necessary vibrations in the thickness direction is not affected by an unnecessary vibration when the W/t ratio is 0.8 or lower (see Patent Document 2); in the third embodiment, the W/t ratio is 0.6, and thus the unnecessary vibration is not caused.

Also, in the graph in FIG. 28, the line slopes downward on the left and right with the peak occurring at a W/t ratio of approximately 0.6, and in the portion in which the W/t is higher than 0.6, the slope is greater than that in the portion in which the W/t is equal to or lower than 0.6.The graphs seems to be roughly symmetrical about the center line, and the same ultrasonic characteristic seems to be achieved also in the portion in which the W/t ratio is equal to or higher than 0.6.However, in actual manufacturing processes, when the width W is adjusted highly accurately it is difficult to form slots such that the width W has variation. Due to this variation, the W/t ratio is slightly different from the value specified in the design phase. With the variation of the W/t ratio, the electromechanical coupling coefficient varies greatly with the sharply slanting surface slope, as shown in FIG. 28. In other words, the influence on the acoustic characteristic of a W/t ratio higher than 0.6 is greater than that of a W/t ratio lower than 0.6.Accordingly, it is desirable to adjust the W/t ratio so that it has a value equal to or lower than 0.6.

As described above, when the W/t is equal to or lower than 0.6, the value of the electromechanical coupling coefficient is high, and an unnecessary vibration mode is not caused; accordingly, the proper acoustic characteristic can be maintained. Also, it is not necessary to make sub elements of the transducer element; accordingly, wiring is facilitated, and the reliability is enhanced (reduction of failure probability) because the number of required lead wires is reduced.

By applying the present invention, it is possible to facilitate wiring and enhance the reliability (reduction of failure probability) because the number of lead wires is reduced while the proper acoustic characteristics are maintained.

Next, the fourth embodiment of the present invention is explained.

Figure 29:
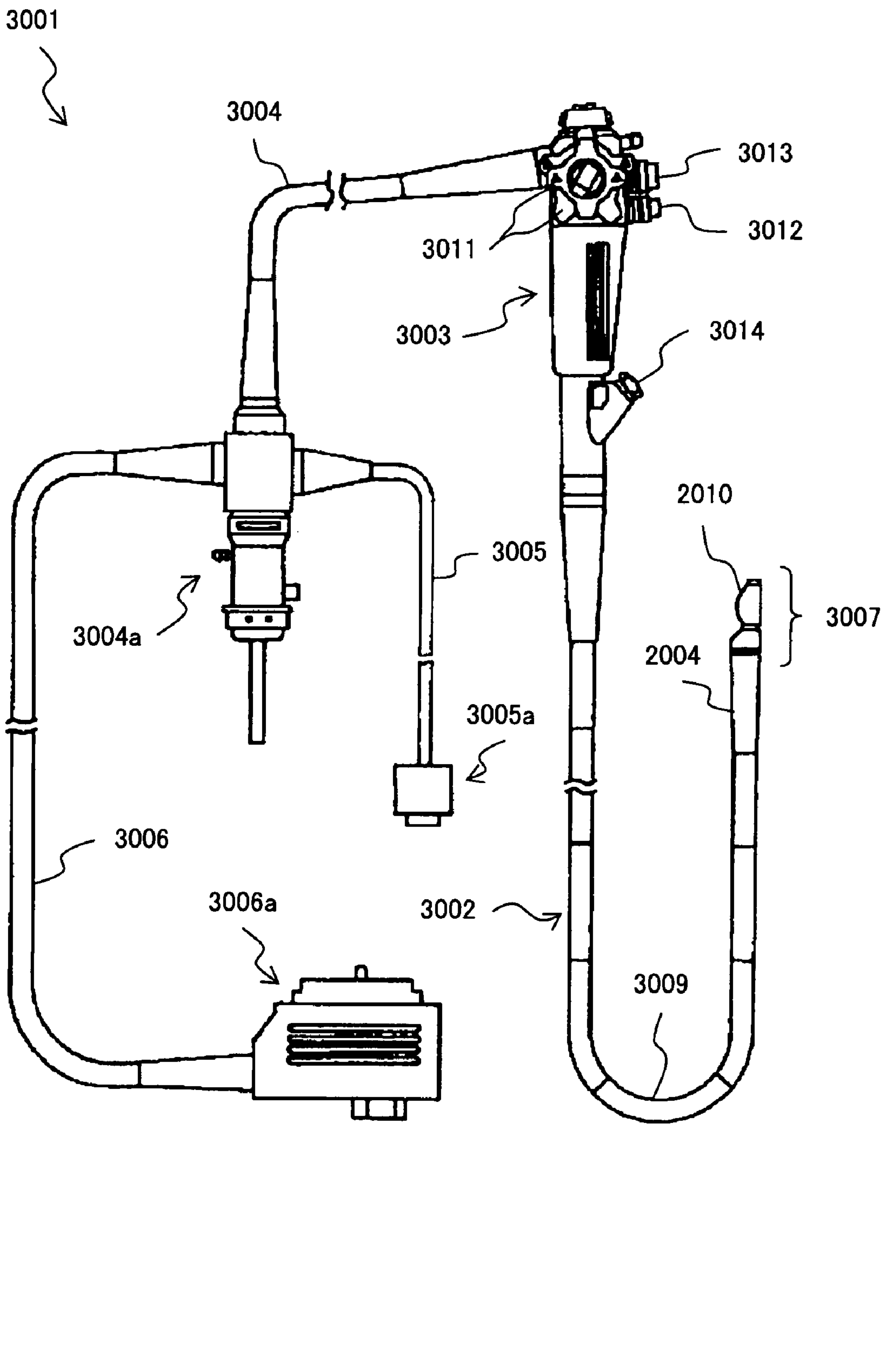
FIG. 29 shows an outline of an ultrasound endoscope according to the present invention.

FIG. 29 shows an outline of an ultrasound endoscope according to the present invention.

An ultrasound endoscope 3001 comprises an insertion unit 3002 that is to be inserted into body cavities, an operation unit 3003 at the proximal end of the insertion unit 3002, and a universal cord 3004 that extends from a side portion of the operation unit 3003.

The universal cord 3004 comprises, at one end thereof, an endoscope connector 3004*a* that is to be connected to a light source device (not shown). Further, an electrical signal cable 3005 detachably connected to a camera control unit (not shown) via an electrical connector 3005*a* and an ultrasonic cable 3006 detachably connected to an ultrasonic observation device (not shown) via an ultrasonic connector 3006*a* both extend from the endoscope connector 3004*a*.

The insertion unit 3002 comprises, in the connected state and in the following order starting from the distal end side, a distal rigid section 3007 formed of hard resin, a curved unit 2004, at the proximal end of the distal rigid section 3007, that can arbitrarily bend, and a flexible tube 3009 that connects the proximal end of the bending unit 2004 and the distal end of the operation unit 3003 and that is elongate and has a small diameter. The ultrasonic transducer 2010 is formed at the distal end of the distal rigid section 3007. The ultrasonic transducer 2010 comprises a plurality of transducer elements that are arrayed for transmitting and receiving ultrasound.

The operation unit 3003 comprises an angulation control knob 3011 for bending the bending unit 2004 to desired directions, an air/water valve 3012 to be used for controlling air-feed and water-feed operations, a suction valve 3013 to be used for controlling suction operations, an instrument channel port 3014 into which instruments that are to be inserted into body cavities are inserted, and the like.

Figure 30:
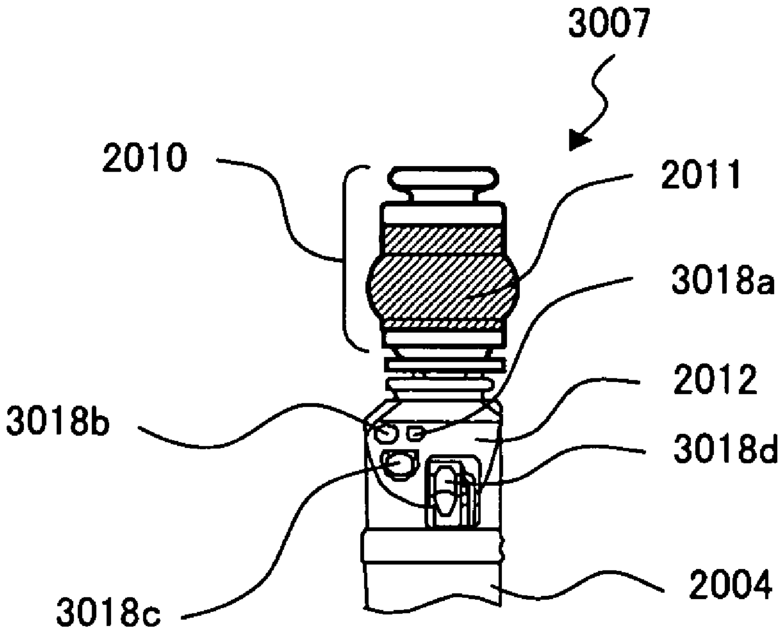
FIG. 30 is an enlarged view of a distal rigid section of the ultrasound endoscope shown in FIG. 29.

FIG. 30 is an enlarged view of the distal rigid section 3007 of the ultrasound endoscope 3001 shown in FIG. 29. This distal rigid section 3007 is explained by referring also to the perspective view in FIG. 22.

At the distal end of the distal rigid section 3007 is the ultrasonic transducer 2010 that allows electronic radial scanning. The ultrasonic transducer 2010 is coated with a material from which the acoustic lens (ultrasonic wave transmitting and receiving unit) 2011 is formed. The distal rigid section 3007 comprises the slanting surface portion 2012. The slanting surface portion 2012 comprises a lighting lens 3018*b* that constitutes a lighting optical unit for casting illumination light to observation target sites, an objective lens 3018*c* that constitutes an optical observation unit that captures the optical images of the observation target sites, a instrument-channel-outlet/suction-channel 3018*d* into which removed sites are sucked and from which instruments are drawn out, and an air/water nozzle 3018*a* serving as an opening through which air and water are fed.

Figure 31:
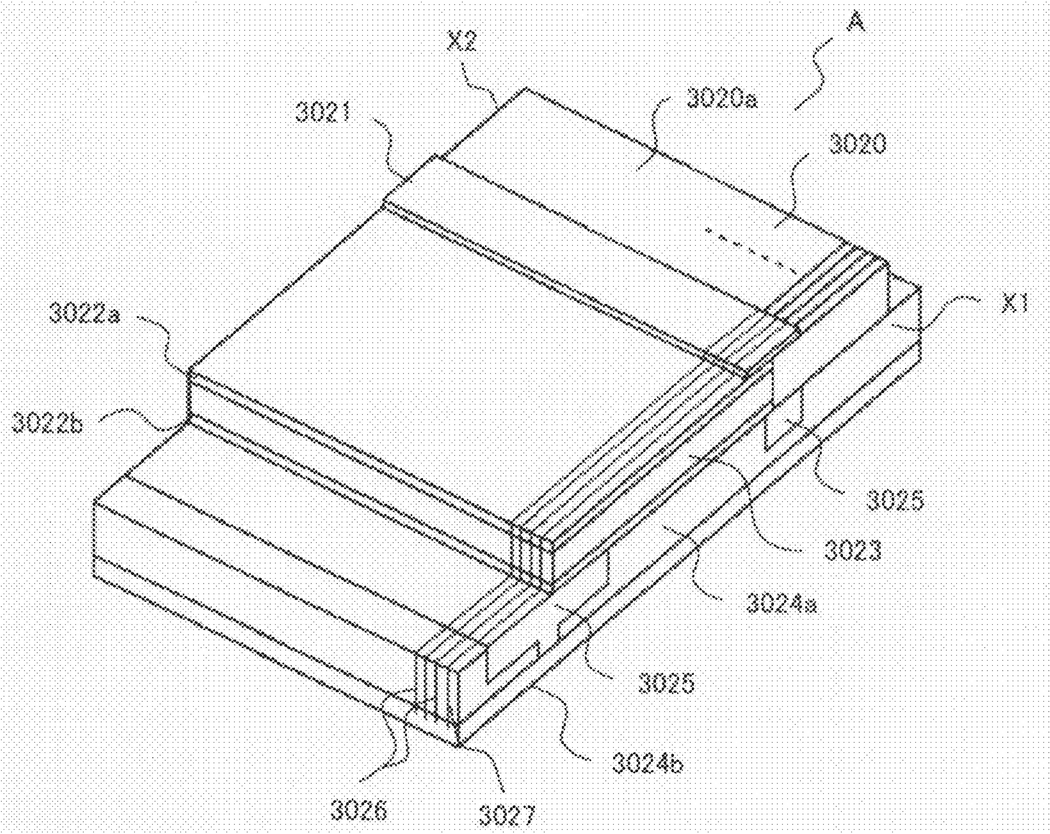
FIG. 31 shows a method of manufacturing an ultrasonic transducer (first view)

FIG. 31 shows a first method of manufacturing an ultrasonic transducer.

In FIG. 31, when the ultrasonic transducer is to be formed, structure A is first formed; structure A comprises a circuit board 3020, an electric conductor 3021, electrode layers 3022 (3022*a* and 3022*b*), a transducer element (piezoelectric device) 3023, acoustic matching layers 3024 (a first acoustic matching layer 3024*a* and a second acoustic matching layer 3024*b*), conductive resin 3025, and grooves 3026. Herein below, the manufacture of structure A is explained.

After forming the second acoustic matching layer 3024*b*, the first acoustic matching layer 3024*a* is formed. Next, grooves that are to be filled with the conductive resin are formed on the first acoustic matching layer 3024*a* by using, for example, a dicing saw (a precision cutting machine), and the grooves are filled with the conductive resin 3025. Next, the transducer element 3023 having the electrode layers 3022*a* and 3022*b* on its opposing surfaces is connected to the first acoustic matching layer 3024*a*.Then, the circuit board 3020 is attached adjacent to the transducer element 3023. On the surface of the circuit board 3020, an electrode layer 3020*a* is formed. Then, the electric conductor 3021 is attached in order to cause the electrode layer 3020*a* and 3022*a* to be electrically conductive to each other.

Slots are formed on structure A by using a dicing saw such that a plurality of grooves (dicing grooves) 3026 each having a width of several tens of micrometers are formed at a constant interval. The width of these grooves is desirably in the range of 20 micrometers to 50 micrometers. The above slots are formed in such a manner that only the second acoustic matching layer 3024*b* is not completely cut such that portions each having a thickness of several tens of micrometers remain uncut. For example, approximately two hundred grooves 3026 are formed evenly on the entirety of structure A. In this configuration, each of the transducers obtained by the dividing process is referred to as a transducer element 3027.

Because the configuration of the two layers is employed in the fourth embodiment, it is desirable that epoxy resin containing resin with particles such as alumina, titania ($TiO_2$) or the like be used as a material for the first acoustic matching layer 3024*a*, and epoxy resin not containing the filler agent is used as a material for the second acoustic matching layer 3024*b*. Also, when the configuration of three layers is employed, epoxy resin or carbon containing machinable ceramics, resin with particles or fibers is used as a material for the first acoustic matching layer, epoxy resin slightly containing (at a content lower than that in the case of the structure of two layers) resin with particles such as alumina or titania ($TiO_2$) is used as a material for the second acoustic matching layer, and epoxy resin not containing the filler agent is used for the third acoustic matching layer.

Figure 32:
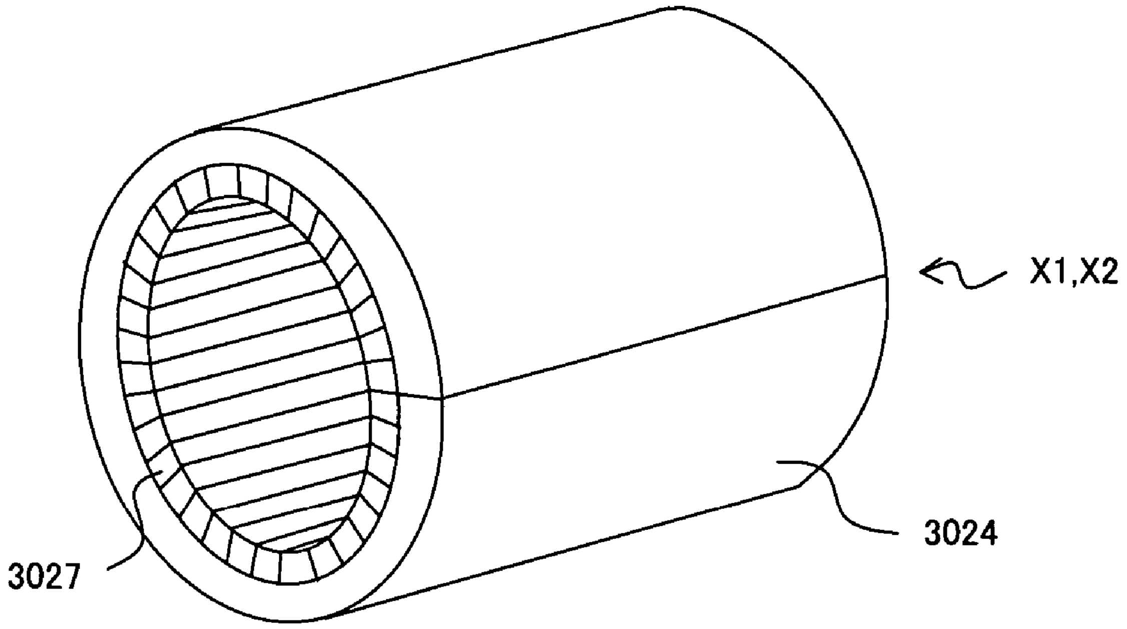
FIG. 32 shows a method of manufacturing an ultrasonic transducer (second view)

Next, as shown in FIG. 32, structure A shown in FIG. 31 is formed into a cylindrical shape such that the sides X1 and X2 thereof face each other. Thereafter, masking tape is pasted on the surface of each trench 3026, except for a portion within a certain length from each end. Then, hard resin 3028 is spread over the surface of each trench 3026 including the masked portions. Thereby, only the portions that are not masked by the masking tape, i.e., only the portions around the ends are filled with the hard resin 3028 (as shown in FIG. 34).

Figure 33:
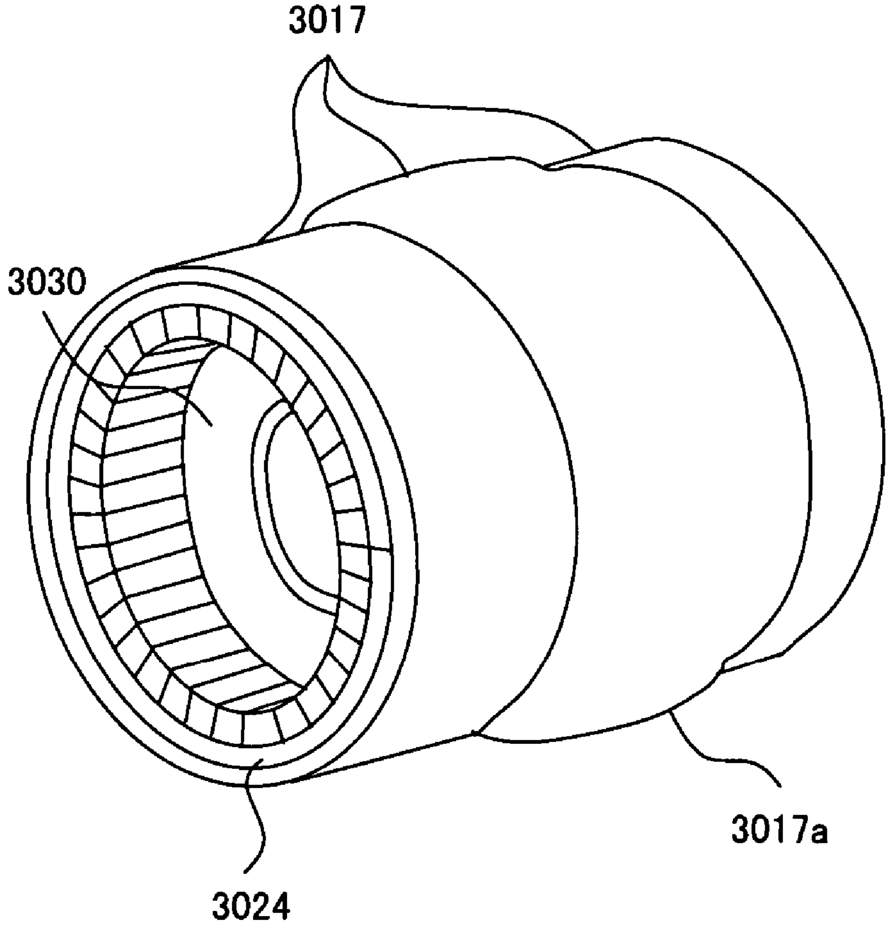
FIG. 33 shows a method of manufacturing an ultrasonic transducer (third view)
Figure 37:
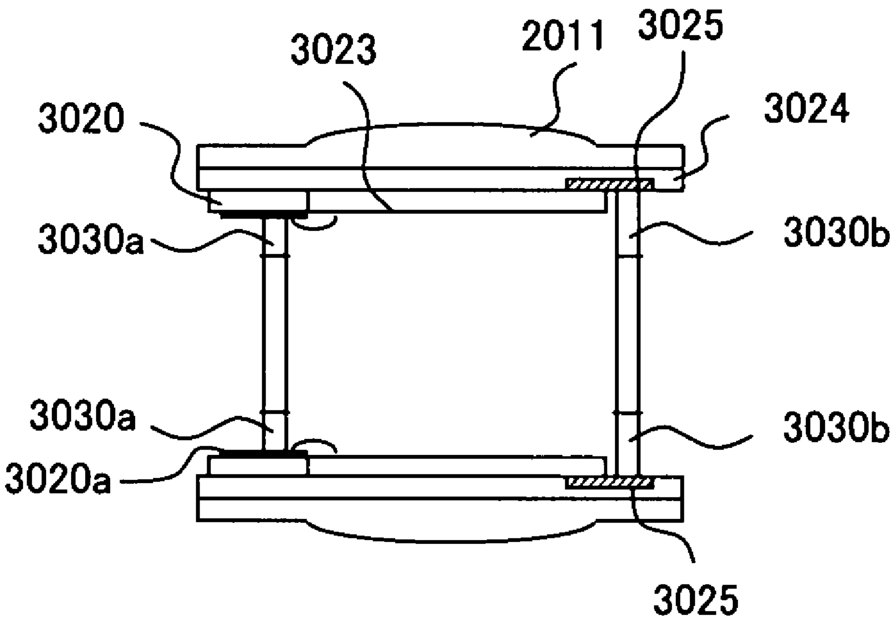
FIG. 37 shows a method of manufacturing an ultrasonic transducer (fourth view)

Next, as shown in FIG. 33, a ring-shaped structural member 3030 (3030*a*) is formed at the inside wall of one of the openings of structure B. The ring-shaped structural member 3030*a* is attached in such a manner that the attached structural member 3030*a* is positioned on the circuit board 3020 (as shown in FIG. 37). A structural member 3030 (3030*b*) is formed at the other opening in a similar manner. The structural member 3030*b* is attached in such a manner that the attached structural member 3030*b* is positioned on the conductive resin 3025 (as shown in FIG. 37).

Figure 34:
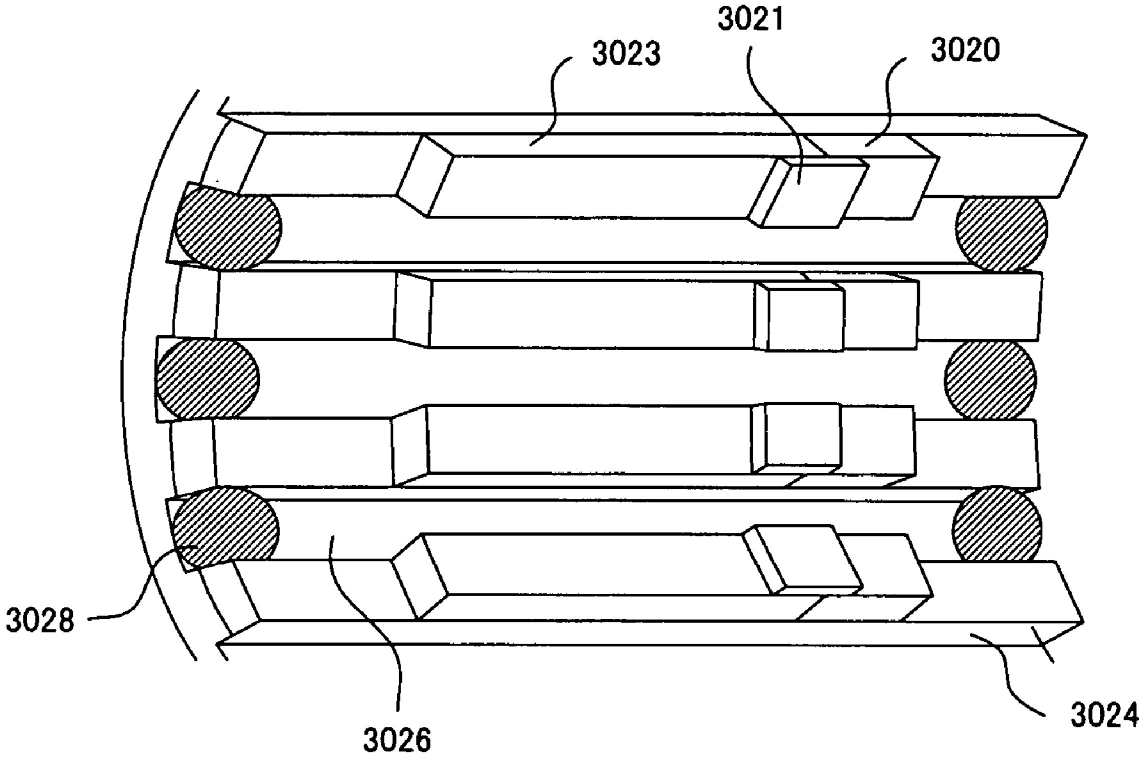
FIG. 34 is an enlarged view that schematically shows the state of structure A, shown in FIG. 31, in which adhesive is applied.
Figure 35:
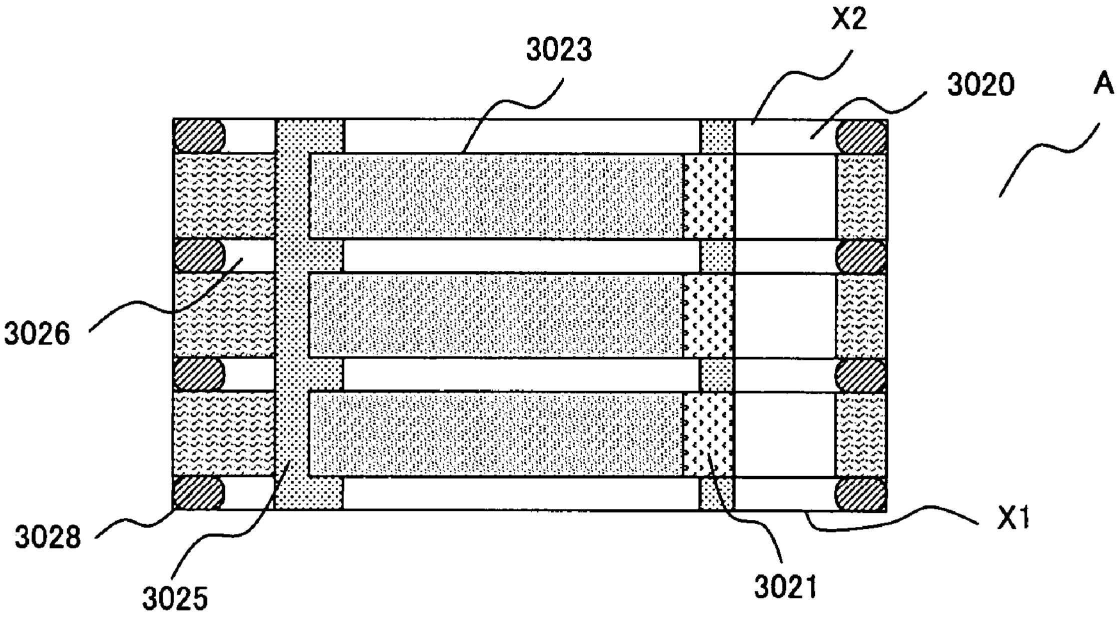
FIG. 35 shows structure A, shown in FIG. 31, to which the adhesive is applied (plan view)
Figure 36:
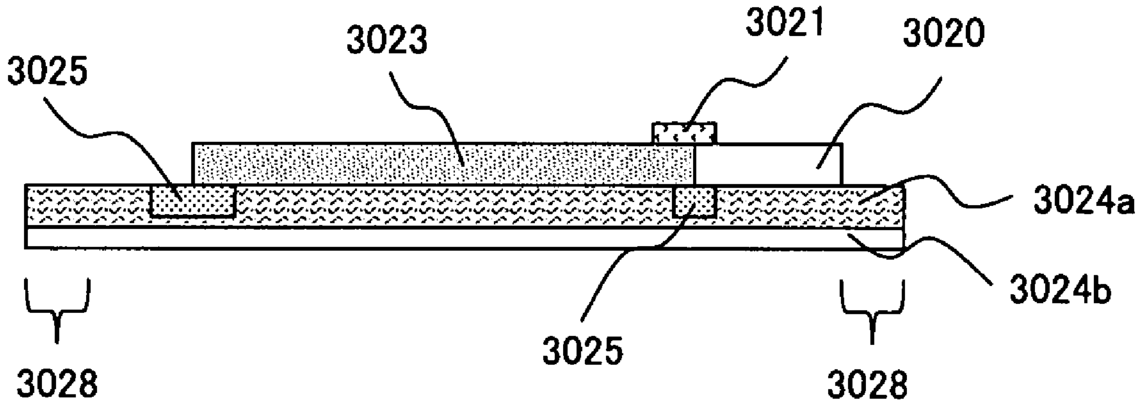
FIG. 36 shows structure A, shown in FIG. 31, to which the adhesive is applied (cross-sectional view)

FIG. 34 is an enlarged view that schematically shows the state of structure B shown in FIGS. 32 and 33 in which adhesive is applied. FIGS. 35 and 36 are views respectively showing structure B above in a flattened manner for the convenience of explanation.

As shown in FIGS. 34 through 36, the hard resin 3028 serving as the adhesive is applied to the locations on each trench 3026 that are at both ends in the longitudinal direction and that do not contact the transducer element 3023. When the portions to which the hard resin is applied are long, tenderness caused in the patients being examined with the ultrasound endoscope device increases; for this reason it is desirable that the hard resin 3028 be at the ends of the grooves 3026 and that the intervals between the transducer elements 3023 and the hard resin 3028 be as long as possible in order to reduce the influence of the crosstalk. Also, as the hard resin 3028, a material such as hard resin containing resin with particles of inorganic substances (calcium carbonate or alumina) is used to increase the viscosity.

Figure 38:
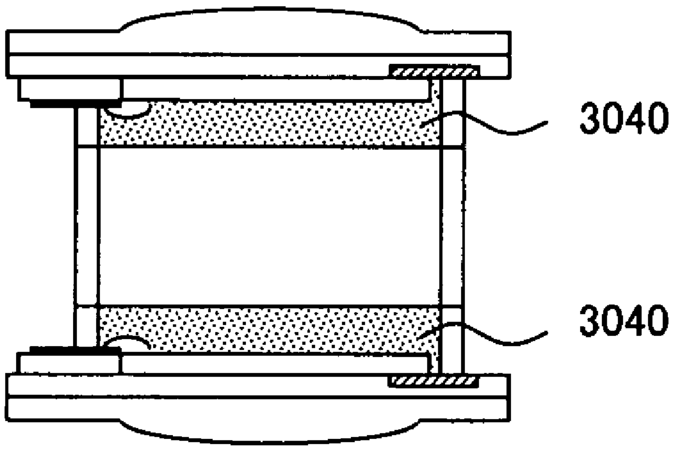
FIG. 38 shows a method of manufacturing an ultrasonic transducer (fifth view)
Figure 39:
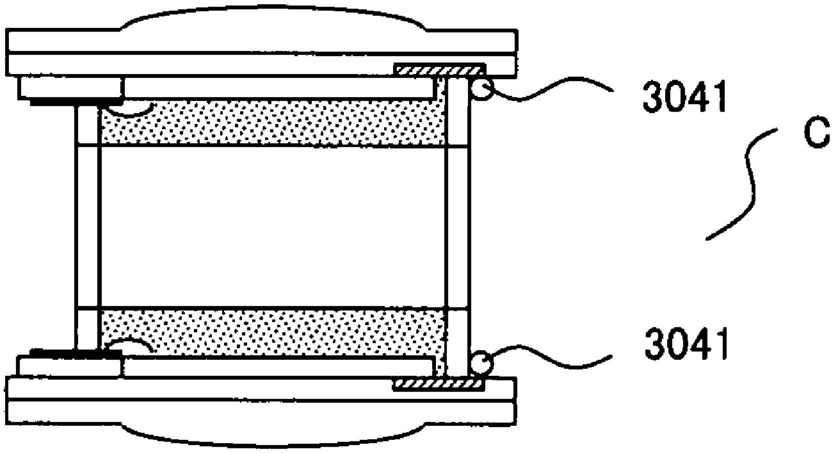
FIG. 39 shows a method of manufacturing an ultrasonic transducer (sixth view)

FIGS. 37 through 39 respectively show the cross sections of structure B to which the structural members 3030 have been attached.

After attaching the structural members 3030 (3030*a* and 3030*b*) (as shown in FIG. 37), the space between the structural members 3030*a* and 3030*b* is filled with a backing material 3040 (as shown in FIG. 38). For the backing material, gel epoxy resin containing resin with particles of alumina is used. Thereafter, an electric conductor (copper wire) 3041 is attached on the conductive resin 3025 (as shown in FIG. 39). Hereinafter, the structure that is formed as shown in FIGS. 37 through 39 is referred to as structure C.

Next, acoustic lenses 3017 are formed over the surface of a cylinder as shown in FIG. 33. The acoustic lenses 3017 may be realized by integrating, with cylindrical shaped structure A, the lenses that have been manufactured independently, and also may be realized in such a manner that molds are inserted into cylindrical shaped structure A and filled with the material of the acoustic lenses. Additionally, among the acoustic lenses 3017, the lens that actually serves as an acoustic lens is lens unit 3017*a*.

Figure 40:
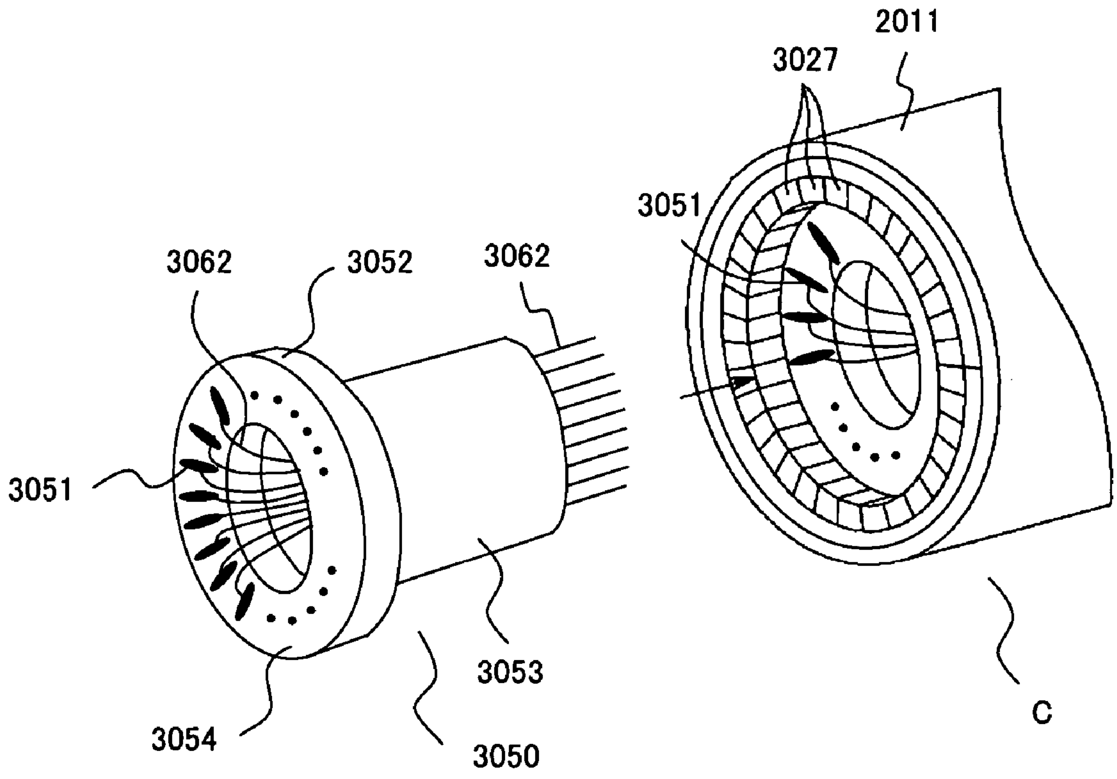
FIG. 40 shows a method of manufacturing an ultrasonic transducer (seventh view)

Next, a cylindrical shaped structural member 3050 is inserted into structure C through one of the openings (the opening on the side having the circuit board 3020) as shown in FIG. 40. This cylindrical shaped structural member 3050 consists of a cylindrical shaped part 3053 and a ring-shaped collar 3052 at one end of the cylindrical shaped part 3053. A printed circuit board 3054 is formed on the surface of the collar 3052, and on the surface of the printed circuit board 3054, several tens to several hundreds of electrode pads 3051 are formed. Further, a bundle of cables 3062 runs through the cylindrical shaped structural member 3050, and one of the ends of each of the cables 3062 is soldered to its corresponding pad 3051 (each of the cables 3062 is soldered to a location, on each of the electrode pads, that is close to the center of the ring). Additionally, for the cables 3062, coaxial cables are usually used for reducing noise.

The cylindrical shaped structural member 3050 is made of an insulative material (for example engineering plastic). Examples of the insulative materials include polysulfone, polyether-imide, polyphenylene oxide, epoxy resin and the like. The surface of the cylindrical shaped part 3053 is plated with a conductive material. When the cylindrical shaped structural member 3050 to which the cables 3062 are connected is inserted into structure C, the collar 3052 in the cylindrical shaped structural member 3050 contacts the structural member 3030, and the position of the cylindrical shaped structural member 3050 is fixed in structure C, i.e., is fixed in the transducer.

Figure 41:
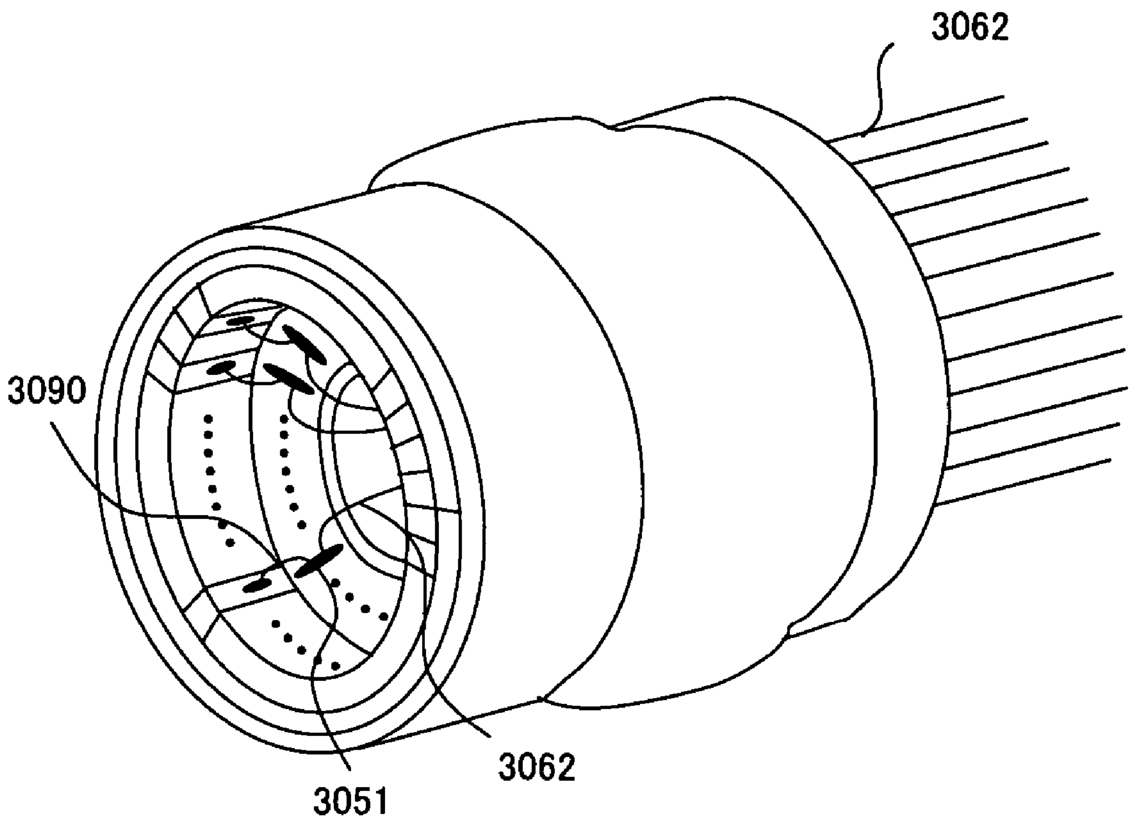
FIG. 41 shows a method of manufacturing an ultrasonic transducer (eighth view)

FIG. 41 shows a state of the transducer in which the location, on each of the electrode pads 3051, that is close to the periphery of the electrode pad 3051 is connected to its corresponding electrode layer 3020*a* on the transducer element 3027 via a lead wire 3090.

Figure 42:
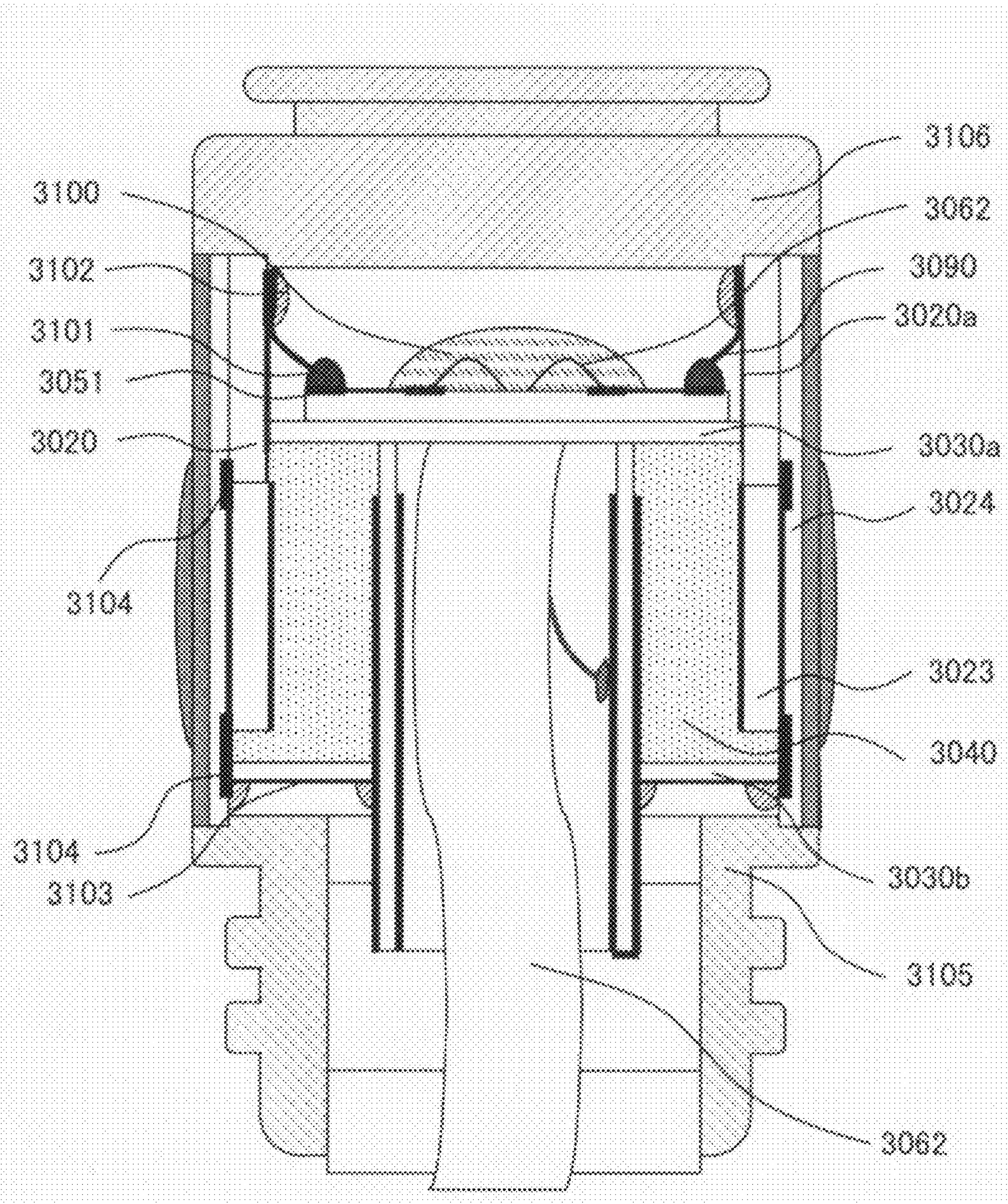
FIG. 42 is a lateral cross-sectional view showing the distal end of the electronic radial scanning ultrasound endoscope shown in FIG. 36.

FIG. 42 is a lateral cross-sectional view showing the distal end of the electronic radial scanning ultrasound endoscope shown in FIG. 41.

The distal end comprises the transducer element 3023, the backing material 3040, and the like, as described above. Also, the cables 3062 are connected to the electrode pad 3051 at locations on the cables that are close to the center of the collar. On each of the electrode pads 3051, the location close to the periphery of the collar is connected to one of the ends of its corresponding lead wires 3090 via solder 3101, and the other end of the lead wire 3090 is connected, via solder 3102, to the electrode layer 3020*a* on the circuit board 3020 of the transducer element. Additionally, in order to prevent a short circuit, lead wires that are short in length are used for lead wires 3090 such that the lead wires do not contact the adjacent electrode layer 3020*a*.Also, in order to prevent the cable 3062 from being disconnected from the electrode pad 3051 when tension is applied to the cable 3062, each connection location between the cable 3062 and the electrode pad 3051 is entirely covered with potting resin 3100. Also, the surface of structural member 3030*b* is coated with a copper foil 3103. Further, the surfaces of the structural members 3030, the acoustic matching layer 3024, and the walls of the cylindrical shaped structural member 3050 are connected via a conductive resin 3014 such as solder. The distal end of the transducer employing the above described configuration comprises a distal end structural member 3106. The distal end also comprises a structural member (hose connection unit) 3105 at the connection portion with the distal rigid section 3007.

As described above, according to the present embodiment, the hard resin is applied to the locations, on each trench between the adjacent ultrasonic transducer elements, that are at both ends in the longitudinal direction and that do not contact the transducer device, and a backing material is applied between the hard resin applied to the trench and the ultrasonic device so that the hard resin does not contact the transducer element; accordingly, the vibrations of the transducer device are not restrained. Also, it is possible to reduce the crosstalk, and to achieve a mechanical strength that allows transducers to be used in endoscopes whose entire length is 20 mm or less.

Also, the hard resin, which restrains vibrations of transducer devices, does not contact the transducer device, and accordingly it is possible to prevent the disturbances in ultrasonic beams.

Additionally, the fourth embodiment has been explained by using the example of an electronic radial scanning ultrasonic transducer; however, the same effect can be achieved by the same configuration even in the convex type in which transducers are arrayed in an arc, and in the linear type in which transducers are arrayed in a line, the explanations of which are omitted.

Additionally, the fourth embodiment can be applied not only to the ultrasonic transducer using the piezoelectric devices as transducer elements, but also to an electronic radial scanning ultrasonic transducer employing the configuration of a capacitive micromachined ultrasonic transducer (C-MUT).

According to the present invention, adhesive is applied to the locations, on the trench between each pair of adjacent ultrasonic transducer elements, that are at both ends in the longitudinal direction and that do not contact the transducer device, and a vibration damping (sound attenuation) agent is applied between the transducer elements. Thereby, the crosstalk and disturbances in ultrasonic beams are prevented while the adhesive does not restrain the vibrations of the transducer elements.

In the above configuration, it is desired that the locations to which the adhesive is applied be at both ends in the longitudinal direction on the grooves that are to be prevented from being affected by the crosstalk; however, the scope of the present invention is not limited to this configuration. The desired effect can be achieved by applying the adhesive to any location that is close to the ends in the longitudinal direction on the grooves.

Additionally, the present invention can be applied to ultrasonic transducers of the radial type, the convex type, and the linear type without changing the configuration of the present invention, and can improve the performance of various types of ultrasound endoscopes.

The invention claimed is:

1. An array ultrasonic transducer comprising transducer elements each including a plurality of transducer sub elements, wherein:

the transducer elements include a conductive sheet for electrically connecting:

piezoelectric devices divided into a plurality of pieces by forming first dicing grooves on an acoustic matching layer and a piezoelectric device plate that are mounted together;

a board connected to the piezoelectric devices in such a manner that the board is adjacent to the divided piezoelectric devices; and electrodes formed on main surfaces of the piezoelectric devices and electrode patterns formed on main surfaces of the board, by coating surfaces in the vicinity of locations at which the board and the piezoelectric devices are connected together with a conductive sheet, and wherein:

the piezoelectric device is divided in such a manner that the piezoelectric devices respectively correspond to the transducer sub elements, and the board is divided in such a manner that the board respectively correspond to the transducer elements, by forming second dicing grooves between two adjacent first dicing grooves formed on the piezoelectric devices and the board being coated with the conductive sheet and on the acoustic matching layer.

* * * * *